(12) United States Patent  
Hirano et al.

(10) Patent No.: US 7,768,089 B2
(45) Date of Patent: Aug. 3, 2010

(54) SEMICONDUCTOR DEVICE

(75) Inventors: Takashi Hirano, Tokyo (JP); Toyosei Takahashi, Tokyo (JP); Toshihiro Sato, Tokyo (JP); Masakazu Kawata, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 215 days.

(21) Appl. No.: 12/213,485

(22) Filed: Jun. 19, 2008

(65) Prior Publication Data

US 2009/0294887 A1 Dec. 3, 2009

(30) Foreign Application Priority Data

May 29, 2008 (JP) .............................. 2008-141512

(51) Int. Cl.
*G09B 1/00* (2006.01)
(52) U.S. Cl. .................. 257/441; 257/444; 257/712; 257/722; 257/778; 257/E21.565; 257/E27.135; 257/E31.117
(58) Field of Classification Search ......... 257/441–449, 257/680, 712–722, 737, 778, E21.56, 27.135, 257/31.117
See application file for complete search history.

(56) References Cited

U.S. PATENT DOCUMENTS

| 5,856,229 | A * | 1/1999 | Sakaguchi et al. .......... 438/406 |
| 6,294,407 | B1 * | 9/2001 | Jacobs ......................... 438/118 |
| 6,373,117 | B1 * | 4/2002 | Theil ........................... 257/444 |
| 6,566,745 | B1 * | 5/2003 | Beyne et al. ................. 257/680 |
| 7,626,156 | B2 * | 12/2009 | Tada et al. ................ 250/208.1 |
| 7,655,889 | B2 * | 2/2010 | Nakamura et al. .......... 250/205 |
| 2002/0097962 | A1 * | 7/2002 | Yoshimura et al. ............ 385/50 |
| 2004/0046248 | A1 * | 3/2004 | Waelti et al. ................. 257/712 |

* cited by examiner

*Primary Examiner*—Michael S Lebentritt
(74) *Attorney, Agent, or Firm*—Smith, Gambrell & Russell, LLP

(57) ABSTRACT

A semiconductor device comprises a semiconductor substrate comprised of an interposer having one surface and a semiconductor element provided on the one surface of the interposer, the semiconductor element including a light receiving portion for receiving light thereon; a transparent substrate having light-transmitting property and one surface facing the light receiving portion, the transparent substrate arranged in a spaced-apart relationship with the one surface of the interposer through a gap formed between the one surface of the interposer and the one surface of the transparent substrate; and a spacer formed in a shape of a frame, the spacer positioned between the one surface of the interposer and the one surface of the transparent substrate for regulating the gap, and the spacer having an inner surface and an outer surface, wherein the one surface of the interposer, the one surface of the transparent substrate and the inner surface of the spacer form a space which is hermetically sealed, and wherein the spacer has a wall including at least one thin wall portion and a thick wall portion other than the at least one thin wall portion, and a vapor permeability of the at least one thin wall portion is greater than a vapor permeability of the thick wall portion, wherein a vapor allowed to flow into the space through the wall of the spacer from an outside preferentially permeates from the space to the outside through the thin wall portion.

23 Claims, 15 Drawing Sheets

SEMICONDUCTOR DEVICE

BACKGROUND OF THE INVENTION

1. Field of the Invention

The present invention relates to a semiconductor device.

2. Description of the Prior Art

A light receiving sensor (or a semiconductor device) for receiving light, which is represented by a CMOS sensor in recent years, is built in an electronic device capable of picking up an image, such as a digital still camera, a digital video camera or the like. It is generally known that the light receiving sensor includes a plate-like semiconductor element (or an imaging element) for receiving light, a glass substrate arranged on a light-incident side of the semiconductor element in a spaced-apart facing relationship with the semiconductor element and a wall portion (or an adhesive portion) for bonding the semiconductor element and the glass substrate together, the wall portion made of a resin material. In the light receiving sensor, an internal space surrounded by the semiconductor element, the glass substrate and the wall portion is hermetically sealed.

Prior to shipment, the light receiving sensor configured as above goes through evaluation tests that evaluate whether the light receiving sensor is acceptable (reliable). Among the evaluation tests, there is a durability test by which the durability of the light receiving sensor is tested in an atmosphere of high temperature and high humidity (e.g., at the temperature of 85° C. and the humidity of 85%). The durability test is carried out by means of, e.g., a handler (or a semiconductor test device or a semiconductor conveyance device). The handler has a chamber in which the atmosphere of high temperature and high humidity as noted above can be set. The durability test is performed by installing the light receiving sensor within the chamber kept in the above atmosphere. During the course of performing the durability test, a vapor (or an air containing moisture) flows into an internal space of the light receiving sensor through the wall portion. When the light receiving sensor is taken out from the chamber at the end of the durability test, the internal space is filled with the vapor (which is not sufficiently discharged through the wall portion). For that reason, it is sometimes the case that the vapor comes into a saturated state. In this case, dew condensation occurs on an inner surface of the wall portion or the glass substrate.

As a solution to the dew condensation problem mentioned above, there has been proposed a light receiving sensor having a flow path formed in a wall portion so that an internal space can communicate with the outside therethrough and a vapor can pass therethrough (see, e.g., JP Patent No. 3830495). In this light receiving sensor, the vapor in the internal space is allowed to flow to the outside through the flow path. However, dust may be infiltrated into the internal space from the outside through the flow path. Once the dust is infiltrated into the internal space, it is impossible to remove the dust.

SUMMARY OF THE INVENTION

It is an object of the present invention to provide a semiconductor device capable of reliably preventing dust from infiltrating into the semiconductor device and capable of reliably preventing occurrence of dew condensation in an inner wall of the semiconductor device, particularly on an inner surface of a transparent substrate.

With this object in mind, one aspect of the present invention is directed to a semiconductor device which comprises a semiconductor substrate comprised of an interposer having one surface and a semiconductor element provided on the one surface of the interposer, the semiconductor element including a light receiving portion for receiving light thereon; a transparent substrate having light-transmitting property and one surface facing the light receiving portion, the transparent substrate arranged in a spaced-apart relationship with the one surface of the interposer through a gap formed between the one surface of the interposer and the one surface of the transparent substrate; and a spacer formed in a shape of a frame, the spacer positioned between the one surface of the interposer and the one surface of the transparent substrate for regulating the gap, and the spacer having an inner surface and an outer surface, wherein the one surface of the interposer, the one surface of the transparent substrate and the inner surface of the spacer form a space which is hermetically sealed, and wherein the spacer has a wall including at least one thin wall portion and a thick wall portion other than the at least one thin wall portion, and a vapor permeability of the at least one thin wall portion is greater than a vapor permeability of the thick wall portion, wherein a vapor allowed to flow into the space through the wall of the spacer from an outside preferentially permeates from the space to the outside through the thin wall portion.

In the semiconductor device noted above, it is preferred that the spacer has two thin wall portions lying opposite to each other across the space.

In the semiconductor device noted above, it is also preferred that the spacer has a diagonal line and a first corner portion and a second corner portion lying on the diagonal line in a plan view, the two thin wall portions are formed near the first corner portion and the second corner portion of the spacer, respectively.

In the semiconductor device noted above, it is also preferred that the thin wall portion is formed by partially removing the wall of the spacer.

In the semiconductor device noted above, it is also preferred that the thin wall portion is formed by partially removing at least one of the inner surface of the spacer and the outer surface of the spacer.

In the semiconductor device noted above, it is also preferred that the spacer has an upper surface being in contact with the one surface of the transparent substrate and an lower surface being in contact with the one surface of the interposer, and the thin wall portion is formed by partially removing at least one of the upper surface and the lower surface of the spacer.

In the semiconductor device noted above, it is also preferred that the thin wall portion has a portion of a varying thickness.

In the semiconductor device noted above, it is also preferred that an average thickness of the thin wall portion is in the range of 2 to 15% to an average thickness of the thick wall portion.

In the semiconductor device noted above, it is also preferred that an average thickness of the thin wall portion is in the range of 10 to 50 μm.

In the semiconductor device noted above, it is also preferred that the spacer is constituted of a cured product of a resin composition containing a photocurable resin.

In the semiconductor device noted above, it is preferred that the photocurable resin contains at least one of an acryl-based resin and a cyclic olefin-based resin.

Another aspect of the present invention is directed to a semiconductor device which comprises a semiconductor substrate including a light receiving portion for receiving light thereon, the light receiving portion having one surface; a transparent substrate having light-transmitting property and one surface facing the light receiving portion, the transparent substrate arranged in a spaced-apart relationship with the one surface of the light receiving portion through a gap formed between the one surface of the light receiving portion and the one surface of the transparent substrate; a first spacer formed in a shape of a frame, the first spacer positioned between the one surface of the light receiving portion and the one surface of the transparent substrate for regulating the gap, and the first spacer having an inner surface and an outer surface; and a second spacer formed in a shape of a frame, the second spacer positioned inside the first spacer for regulating the gap, the second spacer having an inner surface and an outer surface, wherein the one surface of the light receiving portion, the one surface of the transparent substrate and the inner surface of the second spacer form a space which is hermetically sealed, wherein the first spacer has a wall and at least one through-hole formed in the wall, and the second spacer has a wall that can be permeated by a vapor allowed to flow into the space through the wall of the second spacer and the at least one through-hole of the first spacer from an outside, and wherein the vapor flows from the space to the outside through the through-hole of the first spacer and the wall of the second spacer.

In the semiconductor device noted above, it is preferred that a thickness of the wall of the second spacer is smaller than a thickness of the wall of the first spacer.

In the semiconductor device noted above, it is also preferred that the first spacer and the second spacer are spaced apart from each other.

In the semiconductor device noted above, it is also preferred that an average thickness of the wall of the second spacer is in the range of 2 to 15% to an average thickness of the wall of the first spacer.

In the semiconductor device noted above, it is also preferred that an average thickness of the wall of the second spacer is in the range of 10 to 50 μm.

In the semiconductor device noted above, it is also preferred that the wall of the second spacer has a portion of circumferentially varying thickness.

In the semiconductor device noted above, it is also preferred that the first spacer has two through-holes lying opposite to each other across the space and the second spacer.

In the semiconductor device noted above, it is also preferred that the first spacer has a diagonal line and a first corner portion and a second corner portion lying on the diagonal line in a plan view, and the two through-holes are formed near the first corner portion and the second corner portion of the first spacer, respectively.

In the semiconductor device noted above, it is also preferred that the first spacer is permeated by the vapor.

In the semiconductor device noted above, it is also preferred that the second pacer is constituted of a cured product of a resin composition containing a photocurable resin.

In the semiconductor device noted above, it is also preferred that the photocurable resin contains at least one of an acryl-based resin and a cyclic olefin-based resin.

In the semiconductor device noted above, it is also preferred that the semiconductor device further comprises a connecting portion for interconnecting the inner surface of the first spacer and the outer surface of the second spacer.

In accordance with the present invention, the vapor flowing into the space formed within the semiconductor device is rapidly discharged from the space. This ensures that the vapor existing in the space is sufficiently discharged from the space prior to being cooled and saturated. Therefore, it is possible to reliably prevent occurrence of dew condensation in the inner wall of the semiconductor device, particularly on the inner surface of the transparent substrate.

Furthermore, in accordance with the present invention, the space formed within the semiconductor device is kept airtight, which makes it possible to reliably prevent dust from infiltrating into the space (i.e., the inside of the semiconductor device). Therefore, it is possible to reliably prevent substantial reduction in the light transmittance of the transparent substrate, which would otherwise occur when dust adheres to the inner surface of the transparent substrate for instance.

DETAILED DESCRIPTION OF THE PREFERRED EMBODIMENTS

Preferred embodiments of a semiconductor device in accordance with the present invention will now be described in detail with reference to the accompanying drawings.

First Embodiment

Figure 1:
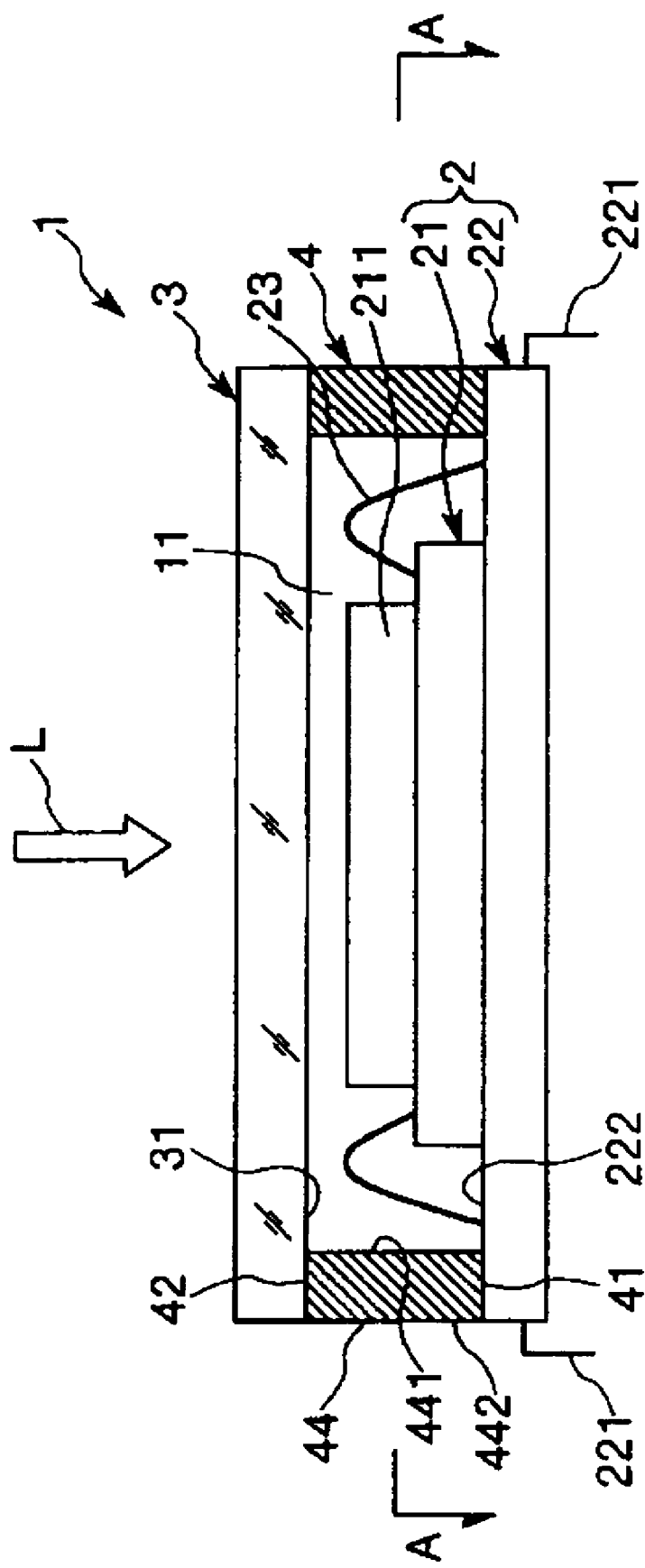
FIG. 1 is a partially sectional view showing a semiconductor device in accordance with a first embodiment of the present invention.
Figure 2:
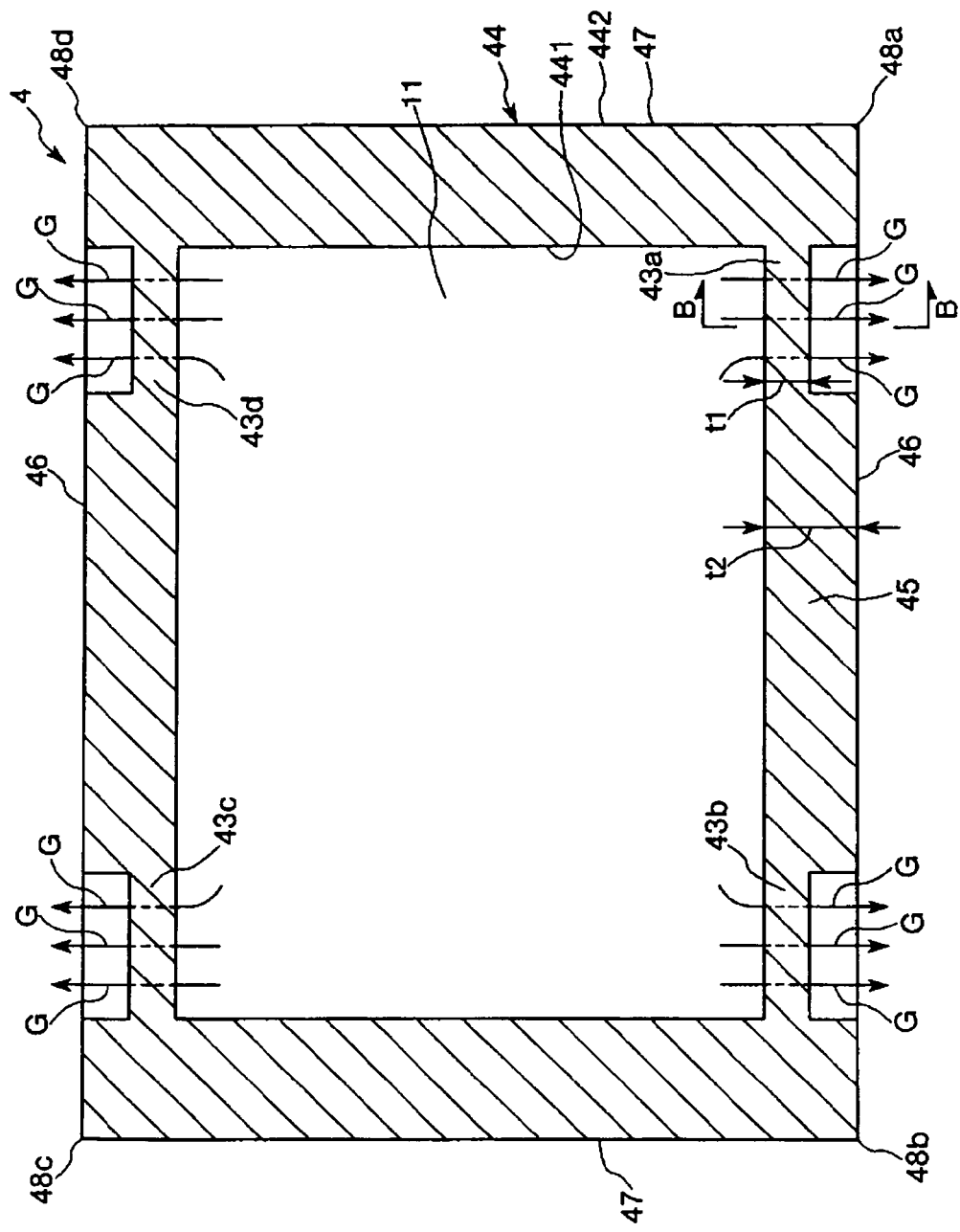
FIG. 2 is a section view (or a horizontal section view) of a spacer of the semiconductor device taken along a line A-A shown in FIG. 1.
Figure 3:
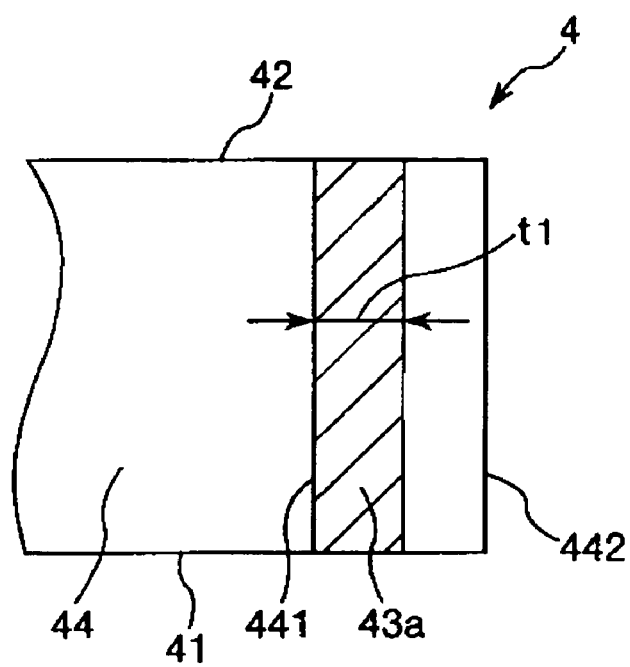
FIG. 3 is a section view (or a vertical section view) taken along a line B-B shown in FIG. 2.

FIG. 1 is a partially sectional view showing a semiconductor device in accordance with a first embodiment of the present invention. FIG. 2 is a section view (or a horizontal section view) of a spacer of the semiconductor device taken along a line A-A shown in FIG. 1. FIG. 3 is a section view (or a vertical section view) taken along a line B-B shown in FIG. 2. Hereinafter, the upper side in FIGS. 1 and 3 (and in FIGS. 4, 5, 7 to 9 and 11 to 15) will be referred to as "top" or "upper" and the lower side in the same drawings will be referred to as "bottom" or "lower", for the sake of convenience in description.

The semiconductor device (or the semiconductor package) 1 shown in FIG. 1 includes a semiconductor substrate 2, a transparent substrate 3 arranged on the upper side of the semiconductor substrate 2 in a spaced-apart facing relationship with the semiconductor substrate 2 and a frame-like spacer 4 positioned between the semiconductor substrate 2 and the transparent substrate 3. The spacer 4 serves to bond the semiconductor substrate 2 and the transparent substrate 3 together. In the semiconductor device 1, there is a hermetically sealed internal space 11 surrounded by the semiconductor substrate 2, the transparent substrate 3 and the spacer 4. As used herein, the term "hermetically sealed internal space 11" means that the internal space 11 is kept closed and is a space closed with no opening (a closed space).

Hereinafter, description will be made on the configuration of individual parts.

The semiconductor substrate 2 includes a semiconductor element (or a light receiving sensor) 21 and an interposer 22 for supporting (or carrying) the semiconductor element 21.

The semiconductor element 21 has a plate-like overall shape. The semiconductor element 21 is provided on its upper surface with a light receiving portion 211 for receiving light L. The light receiving portion 211 may be formed of, e.g., a color filter.

The interposer 22 is constituted from an insulation substrate and is made of various kinds of resin materials such as a polyimide resin, an epoxy resin, a cyanate resin, bismaleimide triazine (a BT resin) and the like. In general, the interposer 22 has a quadrangle shape, such as a square shape, a rectangular shape (employed in the present embodiment) or the like, in a plan view.

A wiring pattern (not shown) made of a conductive metallic material, e.g., copper, is formed on the upper surface (one surface) of the interposer 22 in a specified shape. The wiring pattern is electrically connected to a plurality of leads 221 protruding from an edge portion of the interposer 22. Each of the plurality of leads 221 is mainly constituted of a brazing filler metal such as solder, silver solder, copper solder, phosphor copper solder or the like. An upper surface of the semiconductor element 21 is electrically connected to the wiring pattern formed on the upper surface of the interposer 22 through wires (bonding wires) 23.

The transparent substrate 3 is arranged on a side of the light receiving portion 211 provided on the semiconductor element 21 of the semiconductor substrate 2 (on the upper side of the semiconductor substrate 2) in a spaced-apart facing relationship therewith. A gap is left between the transparent substrate 3 and the light receiving portion 211 provided on the semiconductor element 21 of the semiconductor substrate 2. In other words, the transparent substrate 3 and the light receiving portion 211 provided on the semiconductor element 21 of the semiconductor substrate 2 are arranged in a non-contact relationship.

The transparent substrate 3 is a plate-like rectangular member just like the interposer 22 of the semiconductor substrate 2.

The transparent substrate 3 allows light L to transmit therethrough (The transparent substrate 3 has light-transmitting property). The light L that has transmitted the transparent substrate 3 is received by the light receiving portion 211 provided on the semiconductor element 21 of the semiconductor substrate 2 and is converted to an electric signal in the semiconductor element 21. The electric signal is sent to the wiring pattern on the interposer 22 through the wire 23.

A constituent material of the transparent substrate 3 includes, but is not particularly limited to, e.g., various kinds of glass materials, various kinds of thermoplastic resins and various kinds of thermosetting resins. In the present invention, it is preferred that a glass material is used as the constituent material of the transparent substrate 3. Examples of the glass material include alkali-free glass, soda glass, crystalline glass and quartz glass.

As shown in FIG. 1, the spacer 4 provided between the interposer 22 of the semiconductor substrate 2 and the transparent substrate 3 serves to regulate the clearance between the semiconductor substrate 2 and the transparent substrate 3. The spacer 4 has a rectangular shape (or a quadrangle shape) in a plan view just like the interposer 22 and the transparent substrate 3. The spacer 4 has a lower surface 41 bonded to the whole circumference of an edge portion of an upper surface 222 of the interposer 22 and an upper surface 42 bonded to the whole circumference of an edge portion of a lower surface 31 of the transparent substrate 3. This keeps the air-tightness of the internal space 11, thereby making it possible to reliably prevent dust from infiltrating into the internal space 11 (namely, the interior of the semiconductor device 1). Therefore, it is possible to reliably prevent substantial reduction in the light transmittance of the transparent substrate 3, which would otherwise occur when dust adheres to the lower surface 31 of the transparent substrate 3 for instance.

Referring to FIG. 2, the spacer 4 has a wall 44 in which four thin wall portions 43a, 43b, 43c and 43d with a relatively small thickness are formed. The thin wall portions 43a, 43b, 43c and 43d will be described later.

The spacer 4 allows a vapor G to permeate the wall 44 thereof. The spacer 4 is constituted of a cured product of a resin composition containing a photocurable resin. This makes it possible to form the spacer 4 into a desired shape during the course of manufacturing the semiconductor device 1. Further, this also enables the vapor G to permeate the wall 44 and enhances the shape-keeping ability of the spacer 4.

The photocurable resin includes: an ultraviolet curable resin mainly constituted of an acryl-based compound (or an acryl-based resin); an ultraviolet curable resin mainly constituted of a cyclic olefin-based compound (or a cyclic olefin-based resin); an ultraviolet curable resin mainly constituted of an urethane acrylate oligomer or a polyester urethane acrylate oligomer; an ultraviolet curable resin mainly constituted of at least one member selected from the group consisting of an epoxy-based resin and a vinyl phenol-based resin.

Among them, it is preferable to use ultraviolet curable resins mainly constituted of at least one member selected from the group consisting of the ultraviolet curable resin mainly constituted of the acryl-based compound and the ultraviolet curable resin mainly constituted of the cyclic olefin-based compound. When light is irradiated, the acryl-based compound and the cyclic olefin-based compound are cured at an increased speed, which means that the compounds can be patterned with a relatively small exposure dosage.

<<Acryl-Based Compound>>

In case where the ultraviolet curable resin mainly constituted of the acryl-based compound (acryl-based resin) is used as the photocurable resin, examples of the acryl-based compound include: a monomer such as acrylic ester and methacrylic ester; a difunctional acrylate such as diacrylic ethylene glycol, dimethacrylic ethylene glycol, diacrylic 1,6-hexanediol, dimethacrylic 1,6-hexanediol, diacrylic glycerin, dimethacrylic glycerin, diacrylic 1,10-decandiol, and dimethacrylic 1,10-decandiol; a polyfunctional acrylate such as triacrylic trimethylolpropane, trimethacrylic trimethylolpropane, triacrylic pentaerythritol, trimethacrylic pentaerythritol, hexaacrylic dipentaerythritol, and hexamethacrylic dipentaerythritol. Among these compounds mentioned above, acrylic ester is preferable and more preferably acrylic ester having 1 to 5 of a carbon number in an ester part therein or methacrylic alkylester.

Although there is no particular limitation, a content of the photocurable resin (or the ultraviolet curable resin) may be preferably in the range of 5 to 60 wt % and more preferably in the range of 8 to 30 wt % of a total resin composition of which an adhesive film is made. If the content falls below the lower limit value noted above, there is a possibility that, depending on the kind of the acryl-based compound, the spacer 4 cannot be patterned by irradiation of ultraviolet light. If the content exceeds the upper limit value noted above, there is a possibility that the cured product available after the irradiation of ultraviolet light may lose its firmness.

It is preferred that the resin composition contains a photopolymerization initiator. This ensures that the patternability of a cured product of the resin composition is improved by a photopolymerization resulting from ultraviolet irradiation. Therefore, it becomes possible to form the spacer 4 into a fine shape.

The photopolymerization initiator include, but is not particularly limited to, e.g., benzophenone, acetophenone, benzoin, benzoin isobutyl ether, benzoin methyl benzoate, benzoin benzoate, benzoin methyl ether, benzylphinyl sulfide, benzyl, dibenzyl and diacetyl, one or more of which can be used independently or in combination.

Although there is no particular limitation, a content of the photopolymerization initiator may be preferably in the range of about 0.5 to 5 wt % and more preferably in the range of about 0.8 to 3.0 wt % of the total resin composition. If the content falls below the lower limit value noted above, there is a possibility that, depending on the kind of the photopolymerization initiator, the effect of initiating photopolymerization may be deteriorated. If the content exceeds the upper limit value noted above, it is sometimes a case that reactivity of the photopolymerization becomes too great, consequently reducing preserving property and resolving property of the resin composition.

It is preferred that the resin composition further contains a thermosetting resin.

Examples of the thermosetting resin include: but is not particularly limited to, a novolac-type phenol resin such as a phenol novolac resin, a cresol novolac resin and a bisphenol-A novolac resin; a phenol resin such as a resol phenol resin; a bisphenol-type epoxy rein such as a bisphenol-A epoxy resin and a bisphenol-F epoxy resin; a novolac-type epoxy resin such as a novolac epoxy resin and a cresol novolac epoxy resin; an epoxy resin such as a biphenyl-type epoxy resin, a stilbene-type epoxy resin, a triphenolmethane-type epoxy resin, an alkyl-modified triphenolmethane-type epoxy resin, an epoxy resin containing triazine nucleuses and a dicyclopentadiene-modified phenol-type epoxy resin; a resin containing triazine rings such as an urea resin and a melamine resin; an unsaturated-polyester resin; a bismaleimide resin; a polyurethane resin; a diallyl-phthalate resin; a silicone resin; a resin containing benzoxazine rings; a cyanate ester resin, a mixture containing these resins; and the like.

Among them, it is particularly preferable to use the epoxy resin. This helps enhance heat resistance and adhesion property of a cured product of the resin composition, i.e., the spacer 4.

As the epoxy resin, it is preferable to use, in combination, an epoxy resin kept solid at room temperature (especially, a bisphenol-type epoxy resin) and an epoxy resin kept liquid at room temperature (especially, a silicon-modified epoxy resin). This makes it possible to enhance flexibility and resolving property of an adhesive film used in manufacturing the semiconductor device 1, while maintaining heat resistance of the spacer 4 obtained.

Although there is no particular limitation, a content of the thermosetting resin may be preferably in the range of about 10 to 40 wt % and more preferably in the range of about 15 to 35 wt % of the total resin composition. If the content of the thermosetting resin falls below the lower limit value noted above, there is a possibility that, depending on the kind of the thermosetting resin, the effect of heat resistance may be deteriorated. If the content exceeds the upper limit value noted above, there is a possibility that the effect of toughness of the adhesive film used in manufacturing the semiconductor device 1 may be deteriorated.

It is preferred that the resin composition contains a resin curable with both light and heat. This makes it possible to improve compatibility of the photocurable resin and the thermosetting resin. As a result, it is possible to increase strength of the cured product of the resin composition, i.e., the spacer 4.

Examples of the resin curable with both light and heat include: but is not particularly limited to, a thermosetting resin having light (photo)-reactive groups such as an acryloyl group, a methacryloyl group and a vinyl group; a resin curable with light having heat-reactive groups such as an epoxy group, a phenolic hydroxyl group, an alcoholic hydroxyl group, a carboxyl group, an acid anhydride group, an amino group, and a cyanate group; a (metha)acryl-modified phenol resin; an acryl co-polymer having carboxyl groups and acryl groups in side chains thereof; a (metha)acryloyl polymer containing (metha)acryloyl groups. These resins may be used singly or in combination of two or more of them.

Among them, it is particularly preferable to use the (metha)acryl-modified phenol resin. This makes it possible to employ, in the manufacture of the semiconductor device 1, an aqueous alkali solution less detrimental to the environment than an organic solvent as a developing solution used in patterning the adhesive film and forming the spacer 4. In addition, it is possible to maintain heat resistance of the spacer 4 thus formed.

In case where a thermosetting resin having photoreactive groups is used as the resin curable with both light and heat, a modification ratio (or a substitution ratio) of the photoreactive groups may be, but is not particularly limited to, preferably in the range of about 20 to 80% and more preferably in the range of about 30 to 70% of total reactive groups (the sum of the photoreactive groups and the heat-reactive groups) of the resin curable with both light and heat. If the modification ratio falls within the above-noted range, resolving property of the adhesive film to the aqueous alkali solution becomes especially superior.

In case of using a curable resin having heat-reactive groups, a modification ratio (or a substitution ratio) of the heat-reactive groups may be, but is not particularly limited to, preferably in the range of about 20 to 80% and more preferably in the range of about 30 to 70% of the total reactive groups (the sum of the photoreactive groups and the heat-reactive groups) of the resin curable with both light and heat. If the modification ratio falls within the above-noted range, resolving property of the adhesive film to the aqueous alkali solution becomes especially superior.

An content of the resin curable with both light and heat may be, but is not particularly limited to, preferably in the range of 20 to 70 wt % and more preferably in the range of 30 to 60 wt % of the total resin composition. If the content falls below the lower limit value noted above, there is a possibility that, depending on the kind of the resin curable with both light and heat, the effect of enhancing compatibility may be deteriorated. If the content exceeds the upper limit value noted above, there is a possibility that developing property or resolving property of the adhesive film may be deteriorated.

Insofar as the object of the present invention is not impaired, additives other than the constituent materials mentioned above, such as a filler, a plastic resin, a leveling agent, a deforming agent, a coupling agent and the like, may be added to the resin composition.

<<Cyclic Olefin-Based Compound>>

In case where an ultraviolet curable resin mainly constituted of an cyclic olefin-based compound (cyclic olefin resin) is used as the photocurable resin, examples of a monomer (cyclic olefin monomer) to be used for producing the cyclic olefin-based compound include: a mono-ring monomer such as cyclohexene and cyclooctene; a poly-ring monomer such as norbornene, norbornadiene, dicyclopentadiene, dihydro dicyclo pentadiene, tetracyclo dodecene, tricyclo pentadiene, dihydro tricyclo pentadiene, tetracyclo pentadiene and dihydro tetracyclo pentadiene; a substituted monomer in which functional groups are bonded to these monomers: and the like.

In this regard, examples of the cyclic olefin resin include a polymer obtained from these cyclic olefin monomers. A polymerization method may be any known method, including a random polymerization and a block polymerization.

The cyclic olefin resin can be produced from the cyclic olefin monomer by means of the polymerization methods well-known in the art. Examples of the polymerization method include an addition polymerization method and a ring-opening polymerization method. As the cyclic olefin resin, it is preferable to use a polymer obtained by addition-polymerizing (or co-polymerizing) the norbornene type monomer. In case where a norbornene resin is used as the photocurable resin, there is an advantage that, when forming the spacer 4 in the manufacture of the semiconductor device 1, manufacturing stability is enhanced because the spacer 4 can be patterned with increased accuracy.

Examples of the addition polymer of the cyclic olefin resin include: (1) an addition polymer (or an addition copolymer) of the norbornene type monomer obtained by addition-polymerizing (or co-polymerizing) the norbornene type monomer; and (2) an addition copolymer of the norbornene type monomer and an non-conjugated diene or other monomer, if necessary. These resins can be produced by any polymerization method well-known in the art.

Although it is preferable to use the addition polymer (or the addition copolymer) of the norbornene type monomer obtained by addition-polymerizing (or co-polymerizing) the norbornene type monomer, the present invention is not limited thereto.

It is preferred that the cyclic olefin resin contains reactive functional groups. Specific examples of the reactive functional groups include an epoxy group such as glycidyl ether group or the like, an oxetane group, a carboxyl group, a hydroxyl group, unsaturated bonds and an amino group. Among them, the epoxy group is particularly preferred.

The cyclic olefin resin with epoxy groups is typically producible by directly polymerizing the monomers each containing an epoxy group in their molecules. Alternatively, it is possible to produce the same polymer by a method in which epoxy groups are introduced to side chains thereof through a modification reaction occurring after polymerization. Examples of the modification reaction include a method of graft-reacting the polymer with an unsaturated monomer containing an epoxy group, a method of reacting the reactive functional groups of the polymer with a compound having epoxy groups, and a method of directly epoxidizing the polymer having carbon-carbon dual bonds in its molecules by use of an epoxidizing agent such as peracid, hydroperoxide or the like.

The addition polymer of the cyclic olefin resin can be produced by a coordination polymerization using a metallic catalyst or a radical polymerization. In the coordination polymerization, a polymer is produced by polymerizing monomers in a solution under the presence of a transition metal catalyst (see, e.g., NICOLE R. GROVE et al., Journal of Polymer Science Part B, Polymer Physics, Vol. 37, 3003-3010 (1999)).

Nickel and platinum catalysts representatively used as a metallic catalyst in the coordination polymerization are disclosed in PCT WO 97/33198 and PCT WO 00/20472.

Examples of the metallic catalyst for use in the coordination polymerization include metallic catalysts well-known in the art, such as (toluene) bis(perfluorophenyl) nickel, (mesitylene)bis(perfluorophenyl) nickel, (benzene) bis(perfluorophenyl) nickel, bis(tetrahydro)bis (perfluorophenyl)nickel, bis(ethyl acetate) bis(perfluorophenyl) nickel, bis(dioxane) bis(perfluorophenyl) nickel and the like.

A radical polymerization art is disclosed in, e.g., Encyclopedia of Polymer Science, John Wiley & Sons, 13, 708 (1988).

In general, the radical polymerization is performed by causing monomers to react in a solution under the presence of a radical initiator at an elevated temperature in the range of about 50 to 150° C.

Examples of the radical initiator include azobisisobutyronitrile (AIBN), benzoyl peroxide, lauryl peroxide, azobisisocaptronitrile, azobisisoleronitrile, and t-butyl hydrogen peroxide.

A molecular weight of the cyclic olefin resin can be controlled by, e.g., changing a ratio of an initiator and the monomers or changing a polymerization time. In case of using the coordination polymerization, the molecular weight of the cyclic olefin resin can be controlled by using a chain transfer catalyst as disclosed in U.S. Pat. No. 6,136,499. In the present invention, α-olefin such as ethylene, propylene, 1-hexene, 1-decene, 4-methyl-1-phentene or the like is suitably used in controlling the molecular weight of the cyclic olefin resin.

A weight-average molecular weight of the cyclic olefin resin produced from the cyclic olefin monomer according to the method set forth above is set equal to generally in the range of about 10,000 to 500,000, preferably in the range of about 80,000 to 200,000 and more preferably in the range of about 100,000 to 125,000.

The weight-average molecular weight can be measured by use of standard polynorbornene according to Gel Permeation Chromatography (GPC) (pursuant to ASTM DS3536-91).

As the cyclic polyolefin monomer used in producing the cyclic polyolefin resin having epoxy groups, it is preferable to use the norbornene-type monomer represented by the following general expression (1):

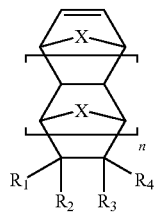

(1)

In general expression (1), the X is one of O, $CH_2$ and $(CH_2)_2$ and the n is an integer of 0 to 5. Each of the $R_1$ to $R_4$ may be any one of: a functional group containing hydrogen, an alkyl group, an alkenyl group, an alkynyl group, an allyl group, an aryl group, an aralkyl group or an ester group, a functional group containing a ketone group; a functional group containing an ether group; and a functional group containing an epoxy group.

Examples of the alkyl group include a methyl group, an ethyl group, a propyl group, an isopropyl group, a butyl group, a penthyl group, a hexyl group, a hepthyl group, an octhyl group, a nonyl group, a decyl group, a dodecyl group, a cyclopenthyl group, a cyclohexyl group, a cyclooctyl group and the like. Examples of the alkenyl group include a vinyl group, an allyl group, a butynyl group and the like. Examples of the alkynyl group include an ethynyl group, a 1-propynyl group, a 2-propynyl group, a 1-butynyl group, a 2-butynyl group and the like. Examples of the aryl group include a phenyl group, a naphtyl group, an anthracenyl group and the like. Examples of the aralkyl group include a benzyl group, a phenethyl group and the like. However, these groups are not limited to these groups.

As for the functional group containing the ester group, the functional group containing the ketone group and the functional group containing the ether group, no restriction is imposed on their structures insofar as they have the relevant group. Specific examples of the functional group containing the epoxy group include a functional group having a glycidyl ether group. No restriction is imposed on the structure of the functional group containing the epoxy group insofar as it has an epoxy group.

Examples of the cyclic olefin monomer that can be used for producing the cyclic olefin resin include: a monomer having alkyl groups such as 5-methyl-2-norbornene, 5-ethyl-2-norbornene, 5-buthyl-2-norbornene, 5-hexyl-2-norbornene and 5-decyl-2-norbornene; a monomer having alkenyl groups such as 5-allyl-2-norbornene, 5-methylidene-2-norbornene, 5-(2-propenyl)-2-norbornene, and 5-(1-methyl-4-pentenyl)-2-norbornene; a monomer having alkynyl groups such as 5-ethynyl-2-norbornene; a monomer having alkoxysilyl groups such as dimethyl-bis((5-norbornene-2-yl)methoxy) silane; a monomer having silyl groups such as 1,1,3,3,5,5-hexamethyl-1,5-dimethylbis(2-(5-norbornene-2-yl)ethyl) trisiloxane; a monomer having aryl groups such as 5-phenyl-2-norbornene and 5-pentafluorophenyl-2-norbornene; a monomer having aralkyl groups such as 5-benzyl-2-norbornene and 5-phenetyl-2-norbornene; a monomer having alkoxysilyl groups such as 5-trimethoxysilyl-2-norbornene and 5-(3-trimethoxypropyl)-2-norbornene; a monomer having hydroxyl groups, ether groups, carboxyl groups, ester groups, acryloyl groups or methacryloyl groups such as 5-norbornene-2-methanol, alkylether thereof, 5-norbornene-2-methylester acetate, 5-norbornene-2-methylester caprate, 5-norbornene-2-carboxylic acid t-butyl ester, 5-norbornene-2-carboxylic acid trimethylsilyl ester, 5-norbornene-2-carboxylic acid 2-hydroxyethyl ester, 5-norbornene-2-methyl-2-carboxylic acid methyl ester, 5-norbornene-2-methyl cinnamate, 5-norbornene-2-methylethyl carbonate, 5-norbornen-2-methyl-t-butyl carbonate and 5-methoxy-2-norbornene; a monomer having epoxy groups such as 5-[(2,3-epoxypropoxy)methyl]-2-norbornene; a monomer having tetracyclo rings such as 8-methoxycarbonyl tetracyclo[4.4.0.1$^{2,5}$.1$^{7,10}$]dodeca-3-ene, 8-t-butoxycarbonyl tetracyclo[4.4.0.1$^{2,5}$.1$^{7,10}$]dodeca-3-ene, 8-cyclohexyl carbonyl tetracyclo[4.4.0.1$^{2,5}$.1$^{7,10}$]dodeca-3-ene, 8-phenoxy carbonyl tetracyclo[4.4.0.1$^{2,5}$.1$^{7,10}$]dodeca-3-ene, 8-tetrahydro piraniroxy carbonyl tetracyclo[4.4.0.1$^{2,5}$.1$^{7,10}$]dodeca-3-ene, 8-methyl-8-methoxycarbonyl tetracyclo[4.4.0.1$^{2,5}$.1$^{7,10}$]dodeca-3-ene, 8-methyl-8-t-butoxycarbonyl tetracyclo[4.4.0.1$^{2,5}$.1$^{7,10}$]dodeca-3-ene, 8-methyl-8-cyclohexyroxy carbonyl tetracyclo[4.4.0.1$^{2,5}$.1$^{7,10}$]dodeca-3-ene, 8-methyl-8-acetoxy tetracyclo[4.4.0.1$^{2,5}$.1$^{7,10}$]dodeca-3-ene, 8,9-di (methoxycarbonyl)tetracyclo[4.4.0.1$^{2,5}$.1$^{7,10}$]dodeca-3-ene, 8,9-di(1-propoxycarbonyl)tetracyclo[4.4.0.1$^{2,5}$.1$^{7.10}$]dodeca-3-ene, 8,9-di(t-butoxycarbonyl)tetracyclo[4.4.0.1$^{2,5}$.1$^{7,10}$]dodeca-3-ene, tetracyclo[4.4.0.1$^{2,5}$.1$^{7,10}$]dodeca-3-ene-8-carboxylic acid, 8-methyl tetracyclo[4.4.0.1$^{2,5}$.1$^{7,10}$]dodeca-3-ene, 8-ethylidene tetracyclo[4.4.0.1$^{2,5}$.1$^{7,12}$]dodeca-3-ene; and the like.

It is generally preferred that the cyclic olefin resin having the epoxy groups is an addition polymer (or an addition copolymer) of a norbornene type monomer as represented by the following general expression (2):

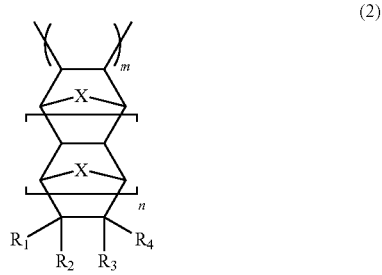

(2)

In general expression (2), the X is one of O, $CH_2$ and $(CH_2)_2$, the n is an integer of 0 to 5 and the m is an integer of 10 to 10,000. Each of the $R_1$ to $R_4$ may be any one of: a functional group containing hydrogen, an alkyl group, an alkenyl group, an alkynyl group, an allyl group, an aryl group, an aralkyl group or an ester group; a functional group containing a ketone group; a functional group containing an ether group; and a functional group containing an epoxy group. Although each of the $R_1$ to $R_4$ may differ from each other in the repeated monomers, at least one of the $R_1$ to $R_4$ of the whole repetition units is a functional group having an epoxy group.

It is particularly preferred that the cyclic olefin resin having such epoxy groups include polymers represented by the following general expressions (3) and (4). These polymers are superior in both flexibility and resolving property of the cured products thereof. As can be seen in the following general expression (4), solubility to a polar solvent such as cyclopentanone or heptanone used as a negative developing solution in the manufacture of the semiconductor device 1 is enhanced by introducing a norbornene monomer having an aralkyl group to the polymer. This provides an advantage in that workability becomes superior.

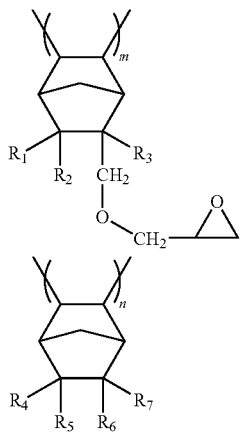

(3)

In general expression (3), each of the m and n denote an integer equal to or greater than 1. Each of the $R_1$ to $R_7$ may be any one of: a functional group containing hydrogen, an alkyl group, an alkenyl group, an alkynyl group, an allyl group, an aryl group, an aralkyl group or an ester group; a functional group containing a ketone group; and a functional group containing an ether group. Each of the $R_1$ to $R_7$ may differ from each other in the repeated monomers.

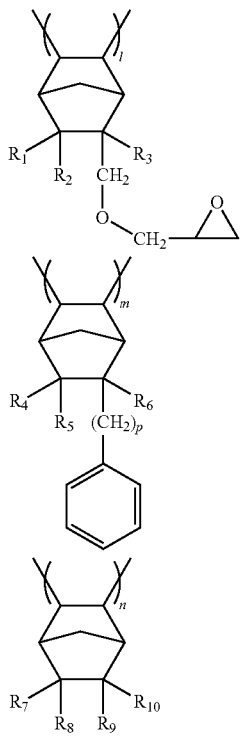

(4)

In general expression (4), each of the l, m and n denote an integer equal to or greater than 1 and the p stands for an integer of 0 to 5. Each of the $R_1$ to $R_{10}$ may be any one of: a functional group containing hydrogen, an alkyl group, an alkenyl group, an alkynyl group, an allyl group, an aryl group, an aralkyl group or an ester group; a functional group containing a ketone group; and a functional group containing an ether group. Each of the $R_1$ to $R_{10}$ may differ from each other in the repeated monomers.

It is particularly preferred that the cyclic olefin resin having epoxy groups includes a polymer represented by the following general expression (5). This polymer is especially superior in both flexibility and resolving property of the cured products thereof. In this regard, if a monomer having a decyl group is introduced to the polymer, a film with reduced elasticity is formed in the cured product thereof. In addition, if a monomer having a phenyl ethyl group is introduced to the polymer, a film with reduced water absorbability, superior chemical resistance and polar solvent solubility is formed in the cured product thereof.

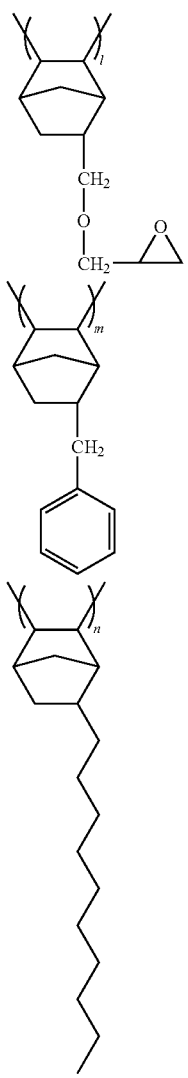

(5)

In general expression (5), each of the l, m and n denote an integer equal to or greater than 1.

A content of a monomer having an epoxy group in the polymer is decided to ensure that the resin composition is cross-linked by exposure and the cured product obtained by cross-linking has a cross-linking density great enough to resist a developing solution during the manufacture of the semiconductor device 1. The content of the monomer having the epoxy group in the polymer is in the range of 5 to 95 mol %, preferably in the range of 20 to 80 mol % and more preferably in the range of 30 to 70 mol %. The thus obtained polymer exhibits superior physical properties, including reduced water absorbability (of smaller than 0.3 wt %), reduced dielectric constant (of less than 2.6), reduced dielectric loss (of 0.001) and a glass transition point in the range of 170 to 400° C.

It is preferred that the resin composition contains a cross-linking agent for use in cross-linking the cyclic olefin resin having epoxy groups. It is possible to use, e.g., a photoreactive material, as the cross-linking agent. In addition to the photoreactive material, it is also possible to use a curing agent that works when heated.

Examples of the curing agent for, when heated, cross-linking the cyclic olefin resin having epoxy groups include aliphatic polyamine, alicyclic polyamine, aromatic polyamine, bisazide, acid anhydride, dicarboxylic acid, polyvalent phenol and polyamide. Examples of the aliphatic polyamine include hexamethylenediamine, triethylenetetramine, diethylenetriamine, tetraethylenepentamine and the like. Examples of the alicyclic polyamine include diaminocyclohexane, 3(4),8(9)-bis(aminomethyl)tricyclo(5,2,1,0$^{2,6}$) decane, 1,3-(diaminomethyl)cyclohexane, menthendiamine, isophoronediamine, N-aminoethyl piperazine, bis(4-amino-3-methylcyclohexyl)methane, bis(4-amino cyclohexyl) methane and the like. Examples of the aromatic polyamine include 4,4'-diamino diphenyl ether, 4,4'-diaminodiphenyl methane, α,α'-bis(4-aminophenyl)-1,3-diisopropyl benzene, α,α'-bis(4-aminophenyl)-1,4-diisopropyl benzene, 4,4'-diamino diphenyl sulfone, methaphenylenediamine and the like. Examples of the bisazide include 4,4'-bis azide benzal (4-methyl)cyclohexanone, 4,4'-diazidechalcone, 2,6-bis(4'-azide benzal)cyclohexanone, 2,6-bis(4'-azidebenzal)-4-methyl-cyclohexanone, 4,4'-diazide diphenyl sulfone, 4,4'-diazide diphenyl methane, 2,2'-diazide stilbene and the like. Examples of the acid anhydride include phthalic anhydride, pyromellitic dianhydride, benzophenone tetracarboxylic acid anhydrate, nadic acid anhydride, 1,2-cyclohexane dicarboxylic anhydride, maleic anhydride-modified porypropylene, a maleic anhydride-modified cyclic olefin resin and the like. Examples of the dicarboxylic acid include fumaric acid, phthalic acid, maleic acid, trimerit acid, high mick acid and the like. Examples of the polyvalent phenol include a phenol novolac resin, a cresol novolac resin and the like. Examples of the polyamide include nylon-6, nylon-66, nylon-610, nylon-11, nylon-612, nylon-12, nylon-46, methoxymethylated polyamide, polyhexamethylenediamine terephthalamide, polyhexamethylene isophthalamide and the like. These curing agents may be used singly or in combination of two or more of them.

It is possible to use, e.g., a photo-acid-generating agent, as a photoreactive material. All kinds of known compounds are usable as the photo-acid-generating agent. The photo-acid-generating agent serves to cross-link epoxy groups and helps to enhance adhesion with the interposer 22 as it is cured later. Examples of the photo-acid-generating agent include an onium salt, a halogen compound, a sulfate and a mixture thereof. Examples of the onium salt include a diazonium salt, an ammonium salt, an iodonium salt, a sulfonium salt, a phosphoric salt, an arsonium salt, an oxonium salt and the like. Insofar as the compound is capable of making a counter anion with the onium salt, there is no restriction in the kind of counter anion. Examples of the counter anion include, but are not limited to, boric acid, arsonic acid, phosphoric acid, antimonic acid, sulfuric acid, carboxylic acid and their chloride.

Examples of the photo-acid-generating agent of the onium salt include triphenyl sulfonium tetrafluoroborate, triphenyl sulfonium hexafluoroarsenate, triphenyl sulfonium hexafluoro phosphate, triphenyl sulfonium diphenyliodonium tetrakis (pentafluorophenyl)borate, 4-thio phenoxy diphenyl sulfonium tetrafluoroborate, 4-thio phenoxy diphenyl sulfonium hexafluoro antimonate, 4-t-butyl phenyl diphenyl sulfonium tetrafluoroborate, tris(4-methylphenyl)sulfonium tetrafluoroborate, tris(4-methylphenyl)sulfonium hexafluorophosphate, tris(4-methoxyphenyl)sulfonium tetrafluoroborate, tris(4-methylphenyl)sulfnium hexafluoro antimonate, tris(4-methylphenyl)sulfonium hexafluorophosphate, tris(t-butyl phenyl)sulfonium tetrakis (pentafluorophenyl)borate, diphenyliodonium tetrafluoroborate, diphenyliodonium hexafluoro antimonate, diphenyliodonium tetrakis(pentafluorophenyl)borate, 4,4'-di-t-butyl phenyl iodonium tetrakis(pentafluorophenyl)borate, (4-methylphenyl-4-(1-methylethyl)phenyl iodonium tetrakis(pentafluorophenyl)borate, 3,3-dinitro diphenyliodonium tetrafluoroborate, 4,4-dinitro diphenyliodonium tetrafluoroborate, 4,4-dinitro diphenyliodonium hexafluoro antimonate and the like. These materials may be used singly or in combination of two or more of them.

Examples of the photo-acid-generating agent containing the halogen compound include, but not limited thereto 2,4,6-tris(trichloromethyl)triazine, 2-allyl-4,6-bis (trichloromethyl) triazine, α,β,α-tribromomethyl phenyl sulfone, α,α-2,3,5,6-hexachloro xylene, 2,2-bis(3,5-dibromo-4-hydroxyphenyl)-1,1,1,3,3,3-hexafluoro xylene, 1,1,1-tris(3,5-dibromo-4-hydroxyphenyl)ethane and the like. These materials may be used singly or in combination of two or more of them.

Examples of the photo-acid-generating agent of the sulfate include 4,4'-di-t-butyl phenyl iodonium triflate, 4,4',4"-tris(t-butylphenyl)sulfonium triflate, 2-nitrobenzyl tosylate, 2,4-dinitrobenzyl tosylate, 2,6-dinitrobenzyl tosylate, 2-nitrobenzylmethylsulfonate, 9,10-dimethoxy anthracene-2-sulfonate, 1,2,3-tris (methanesulfonylroxy)benzene, 1,2,3-tris (ethanesulfonylroxy)benzene, 1,2,3-tris (propanesulfonylroxy)benzene and the like.

Among these materials mentioned above, it is preferred that the photo-acid-generating agent uses 4,4'-di-t-butyl phenyl iodonium triflate, 4,4',4"-tris(t-butylphenyl)sulfonium triflate, diphenyliodonium tetrakis (pentafluorophenyl)borate, triphenyl sulfonium diphenyliodonium tetrakis(pentafluorophenyl)borate, 4,4'-di-t-butyl phenyl iodonium tetrakis(pentafluorophenyl)borate, tris(t-butylphenyl) sulfoniumtetrakis(pentafluorophenyl)borate, (4-methylphenyl-4-(1-methylethyl)phenyl iodonium tetrakis (pentafluorophenyl)borate or a mixture containing these photo-acid-generating agents.

A blending ratio of the photo-acid-generating agent in the present invention is preferably in the range of about 0.1 to 100 parts by weight and more preferably in the range of about 0.1 to 10 parts by weight, based on 100 parts by weight of the polymer (or the cyclic olefin resin).

If necessary, a sensitizer may be used in the resin composition in order to increase photosensitivity. The sensitizer is capable of broadening the wavelength range in which the photo-acid-generating agent can be activated. The sensitizer can be added in an amount that does not directly affect the cross-linking reaction of the polymer (or the cyclic olefin resin).

Optimally usable as the sensitizer is a compound that has a maximum absorbance index near a light source (i.e., the ultraviolet light) as used and has an ability to efficiently transfer the absorbed energy to the photo-acid-generating agent. As the sensitizer of the photo-acid-generating agent, it is possible to use, e.g., cycloaromatic compounds such as anthracene, pyrene, parylene or the like. More specifically, it is possible to use 2-isopropyl-9H-thioxanthene-9-ene, 4-isopropyl-9H-thioxanthene-9-one, 1-chloro-4-propoxy thioxanthene, phenothiazine or a mixture thereof.

A blending ratio of the photo-acid-generating agent is preferably in the range of about 0.1 to 10 parts by weight and more preferably in the range of about 0.2 to 5 parts by weight, based on 100 parts by weight of the polymer (or the cyclic olefin resin). If a light source has a long wavelength just like a g-ray (of 436 nm) and an i-ray (of 365 nm), the sensitizer is effective in activating the photo-acid-generating agent.

By adding a small quantity of an acid scavenger to the resin composition, it is possible to enhance resolution of the spacer 4 patterned and formed in the process of manufacturing the semiconductor device 1. The acid scavenger acts to absorb an acid diffused to unexposed portions during photochemical reaction.

The acid scavenger includes, but is not limited to, pyridine, lutidine, phenothiazine, and secondary or tertiary amine such as tri-n-propylamine, triethylamine or the like.

A blending ratio of the acid scavenger is preferably in the range of about 0.01 to 0.05 parts by weight, based on 100 parts by weight of the polymer (or the cyclic olefin resin).

If necessary, additives such as a filler, a leveling agent, an antioxidant, a flame retardant, a plasticizer, a silane coupling agent and the like may be added to the resin composition that includes the cyclic olefin resin having epoxy groups and the photo-acid-generating agent.

A method of manufacturing a semiconductor device will be described.

First, a plate-like base material (not shown), which is to become a spacer 4, is formed on an upper surface 222 of an interposer 22. The base material is made of the resin composition set forth above.

In case where an acryl-based resin is used as a thermosetting resin contained in the resin composition, the base material is produced by forming an adhesive sheet mainly constituted of the resin composition on a substrate differing from the adhesive sheet, bonding the substrate with the adhesive sheet to the upper surface 222 of the interposer 22 and separating the substrate from the interposer 22. In case where a cyclic olefin resin is used as the thermosetting resin contained in the resin composition, the base material is produced by supplying varnish (a liquid phase material) mainly constituted of the resin composition to the upper surface 222 of the interposer 22 and then drying the varnish thus supplied.

Next, the upper surface of the base material is covered with a mask member (not shown). The mask member has a shape in a plan view which is the same as the blank portions (the region inside of the wall 44 and the regions outside the thin wall portions 43a, 43b, 43c and 43d in FIG. 2) of the spacer 4 excluding the regions hatched in FIG. 2. Ultraviolet light is irradiated toward the mask member in the state that the upper surface of the base material is covered with the mask member. Thus, the resin composition in the portions of the base material irradiated by the ultraviolet light (i.e., the portions to become the spacer 4) is photo-cured.

Next, developing is performed to remove the portions of the base material irradiated by the ultraviolet light. By doing so, it is possible to produce the spacer 4 having the thin wall portions 43a, 43b, 43c and 43d as shown in FIG. 2.

Next, a semiconductor element 21 having a light receiving portion 211 is placed on the interposer 22.

Next, a functional surface of the semiconductor element 21 is connected to terminals of the interposer 22 by means of wires 23.

Next, a transparent substrate 3 is thermally compression-bonded to an upper surface 42 of the spacer 4, thereby producing a semiconductor device 1 as shown in FIG. 1.

Prior to its shipment, the thus obtained (or manufactured) semiconductor device 1 undergoes, e.g., a durability test for evaluating whether the semiconductor device 1 is durable in an atmosphere of high temperature and high humidity (e.g., at the temperature of 85° C. and the humidity of 85%). The durability test is carried out by means of, e.g., a so-called handler (not shown) having a chamber in which the atmosphere of high temperature and high humidity as noted above can be set. The durability test is performed by placing the semiconductor device 1 within the chamber set in the atmosphere. When performing the durability test, a vapor G is allowed to flow into the internal space 11 of the semiconductor device 1 through the wall 44 of the spacer 4. If the semiconductor device 1 is taken out from the chamber at the end of the durability test, it is sometimes the case that the vapor G is not sufficiently removed from the hermetically sealed internal space 11 through the wall 44 and is cooled into a saturated state. At this time, there is a possibility that dew condensation occurs in the inner circumferential portion (or the inner circumferential surface) of the wall 44 and the lower surface 31 of the transparent substrate 3. If dew condensation occurs in the transparent substrate 3, the light transmittance of the transparent substrate 3 is substantially reduced.

With the semiconductor device 1 of the present embodiment, however, it is possible to reliably prevent occurrence of such a problem (occurrence of dew condensation). Hereinafter, description will be made in this regard.

As described above, the thin wall portions 43a, 43b, 43c and 43d are formed in the spacer 4. Referring to FIG. 2, each of the thin wall portions 43a, 43b, 43c and 43d has a thickness (an average thickness) t1 smaller than a thickness (an average thickness) t2 of the remaining portion of the spacer 4 (hereinafter, this portion will be referred to as "thick wall portion 45").

The thin wall portions 43a, 43b, 43c and 43d are respectively arranged in the long sides 46 and not the short sides 47. The thin wall portions 43a and 43b are positioned in the lower long side in FIG. 2, and the thin wall portions 43c and 43d are positioned in the upper long side in FIG. 2.

The thin wall portions 43a and 43c are positioned near respective corner portions 48a and 48c lying on one diagonal line of the spacer 4. The thin wall portions 43b and 43d are positioned near respective corner portions 48b and 48d lying on the other diagonal line of the spacer 4.

Seeing that the thin wall portions 43a, 43b, 43c and 43d have the same configuration (shape), the thin wall portion 43a alone will be representatively described hereinbelow.

In the spacer 4, as the thin wall portion 43a is smaller in thickness than the thick wall portion 45, vapor G permeability of the thin wall portion 43a becomes greater (or higher) than that of the thick wall portion 45.

As mentioned earlier, the semiconductor device 1 is taken out from the chamber of the handler at the end of the durability test. In the semiconductor device 1 thus taken out, the vapor G entered in the internal space 11 tends to flow toward the outside through the wall 44 of the spacer 4. At this time, the vapor G is rapidly discharged through the thin wall portion 43a rather than the thick wall portion 45. In other words, the discharge of the vapor G is accelerated by the thin wall portion 43a (see FIG. 2). This ensures that the vapor G is sufficiently discharged from the internal space 11 before it is cooled and saturated within the internal space 11. This makes it possible to reliably prevent occurrence of dew condensation in the inner wall of the semiconductor device 1 (in the inner circumferential portion or inner circumferential surface 441 of the wall 44 or the lower surface 31 of the transparent substrate 3), particularly in the lower surface 31 of the transparent substrate 3.

The thin wall portion 43a is a region (or a portion) formed by partially removing the outer circumferential portion 442 (the outer portion) of the wall 44 of the spacer 4 by the removal method set forth above. A thickness t1 of the thin wall portion 43a remains constant along the circumferential direction of the spacer 4 (or the left-and-right direction in FIG. 2) and along the height direction of the spacer 4 (or the up-and-down direction in FIG. 3). The thickness t1 is preferably in the range of 0.5 to 30% and more preferably in the range of 1 to 15% of a thickness t2 of the thick wall portion 45. More specifically, in case where the thickness t2 is equal to about 400 μm, the thickness t1 is preferably in the range of about 2 to 120 μm and more preferably in the range of about 4 to 60 μm.

By adopting such a range of numerical value, it is possible to allow the vapor G to pass through the thin wall portion 43a easily (or rapidly) and reliably, while maintaining strength (compression strength and bending strength) of the thin wall portion 43a.

As mentioned above, the thin wall portions 43a and 43c are respectively positioned near the corner portions 48a and 48c of the spacer 4, and the thin wall portions 43b and 43d are respectively positioned near the corner portions 48b and 48d of the spacer 4. In other words, the thin wall portions 43a and 43c are positioned opposite to each other across the space 11 (in a spaced-apart relationship as far as possible). Similarly, the thin wall portions 43b and 43d are positioned opposite to each other across the space 11. Such an arrangement assures enhanced escape of the vapor G, as compared to a case where the thin wall portions 43a, 43b, 43c and 43d are concentratedly arranged along one long side 46. In other words, the vapor G is apt to be uniformly discharged through the respective thin wall portions 43a, 43b, 43c and 43d, regardless of the configuration of the semiconductor substrate 2 (e.g., the shape (size) and location thereof in the internal space 11).

Since the spacer 4 needs to secure bonding strength (bonding area) with respect to, e.g., the transparent substrate 3 and the semiconductor substrate 2 (the interposer 22), and to secure mechanical strength (physical strength) against compression and bending, it is desirable to make the wall 44 of the spacer 4 relatively thick. On the other hand, since the spacer 4 needs to discharge the vapor G, it is desirable to make the wall 44 of the spacer 4 relatively thin. This means that two contradictory structural features (properties) are required in the spacer 4.

In view of this, the spacer 4 is designed so that the strength (bonding strength and mechanical strength) thereof can be maintained mainly by virtue of the thick wall portion 45 and the function of discharging the vapor G can be governed mainly by means of the thin wall portions 43a, 43b, 43c and 43d. This enables the spacer 4 to comply with the contradictory structural features.

As can be seen in FIG. 2, a thickness t2 of the long sides 46 of the wall 44 of the spacer 4 is smaller than a thickness t2 of the short sides 47 thereof in planar view. Therefore, the vapor G is more easily escaped through the long sides 46 than through the short sides 47. The thin wall portions 43a, 43b, 43c and 43d are formed in the long sides 46 whose thickness t2 is smaller than that of the short sides 47. With the semiconductor device 1 of the present embodiment, the vapor discharging function of the long sides 46 superior to that of the short sides 47 is combined with the vapor G discharging function of the thin wall portions 43a, 43b, 43c and 43d positioned in the long sides 46, whereby the vapor G in the internal space 11 is discharged sufficiently and reliably. This makes it possible to reliably prevent occurrence of dew condensation on the lower surface 31 of the transparent substrate 3.

While the thin wall portions 43a, 43b, 43c and 43d are arranged in the long sides 46 according to the configuration shown in FIG. 2, the present invention is not limited thereto. As an alternative example, the thin wall portions 43a, 43b, 43c and 43d may be arranged in the short sides 47 or both in the long sides 46 and the short sides 47.

An additional thin wall portion other than the thin wall portions 43a, 43b, 43c and 43d may be formed somewhere in the long sides 46 (in the middle region thereof) or in the short sides 47.

Second Embodiment

Figure 4:
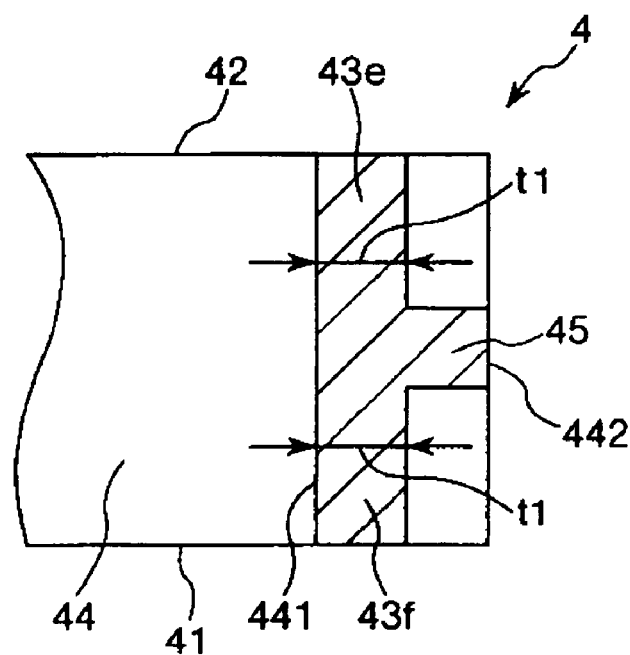
FIG. 4 is a vertical section view showing a spacer of a semiconductor device in accordance with a second embodiment of the present invention.

FIG. 4 is a vertical section view showing a spacer of a semiconductor device in accordance with a second embodiment of the present invention.

Hereinafter, the semiconductor device in accordance with the second embodiment of the present invention will be described with reference to FIG. 4. Such description will be made with emphasis placed on the points differing from the preceding embodiment. The same points will be omitted from description.

The present embodiment is the same as the first embodiment, except a difference in a shape (forming mode) of thin wall portions.

In the spacer 4 shown in FIG. 4, the upper and lower regions of the outer circumferential portion 442 of the wall 44 are removed. This produces thin wall portions 43e and 43f positioned one above another and a thick wall portion 45 positioned between the thin wall portions 43e and 43f.

The configuration of the spacer 4 according to the present embodiment is effective in case where an attempt is made to control discharge quantity of the vapor G. In addition, there is an advantage in that reduction in strength of the wall 44 resulting from formation of the thin wall portions 43e and 43f is relieved by the thick wall portion 45, thereby increasing the strength of the wall 44.

While a thickness t1 of the thin wall portion 43e is the same as a thickness t1 of the thin wall portion 43f according to the configuration shown, the present invention is not limited thereto. Alternatively, the thin wall portions 43e and 43f may differ from each other in the thickness. In case where there is a difference in the thickness t1 of the thin wall portions 43e and 43f, the thin wall portion 43e may be thicker than the thin wall portion 43f, and vice versa.

Third Embodiment

Figure 5:
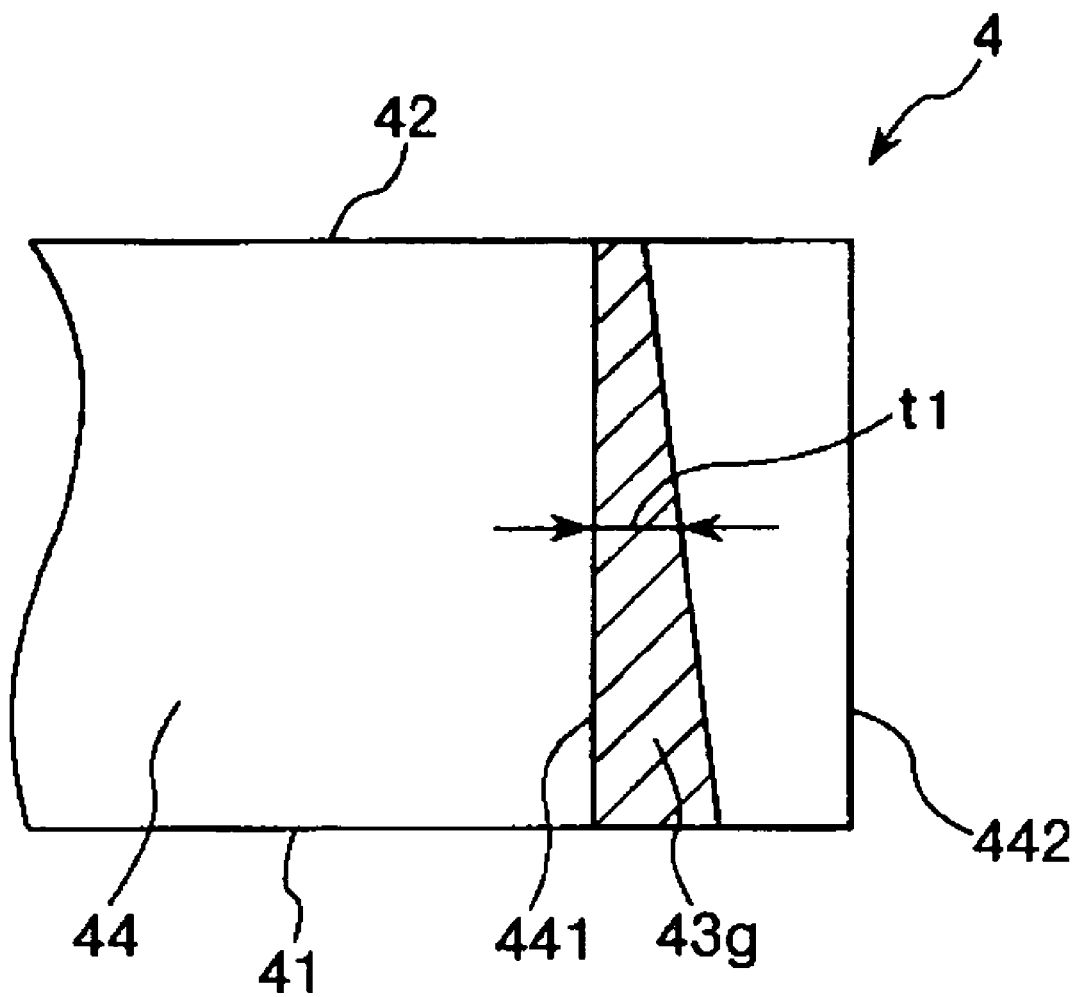
FIG. 5 is a vertical section view showing a spacer of a semiconductor device in accordance with a third embodiment of the present invention.

FIG. 5 is a vertical section view showing a spacer of a semiconductor device in accordance with a third embodiment of the present invention.

Hereinafter, the semiconductor device in accordance with the third embodiment of the present invention will be described with reference to FIG. 5. Such description will be made with emphasis placed on the points differing from the preceding embodiments. The same points will be omitted from description.

The present embodiment is the same as the first embodiment, except a difference in a shape of thin wall portions.

In the spacer 4 shown in FIG. 5, a thickness t1 of a thin wall portion 43g varies along the up-and-down direction in FIG. 5. In other words, the thickness t1 of the thin wall portion 43g is gradually increased downwards. Thus, strength (compression strength and bending strength) of the thin wall portion 43g becomes greater than that of the thin wall portion 43a (or the thin wall portions 43b, 43c and 43d) of the first embodiment.

In the thin wall portion 43g, the vapor G can pass through an upper region more easily than through a lower region in FIG. 5. Such a shape of the thin wall portion 43g is effective in case where an attempt is made to discharge increased quantity of the vapor G through the upper region of the thin wall portion 43g.

Fourth Embodiment

Figure 6:
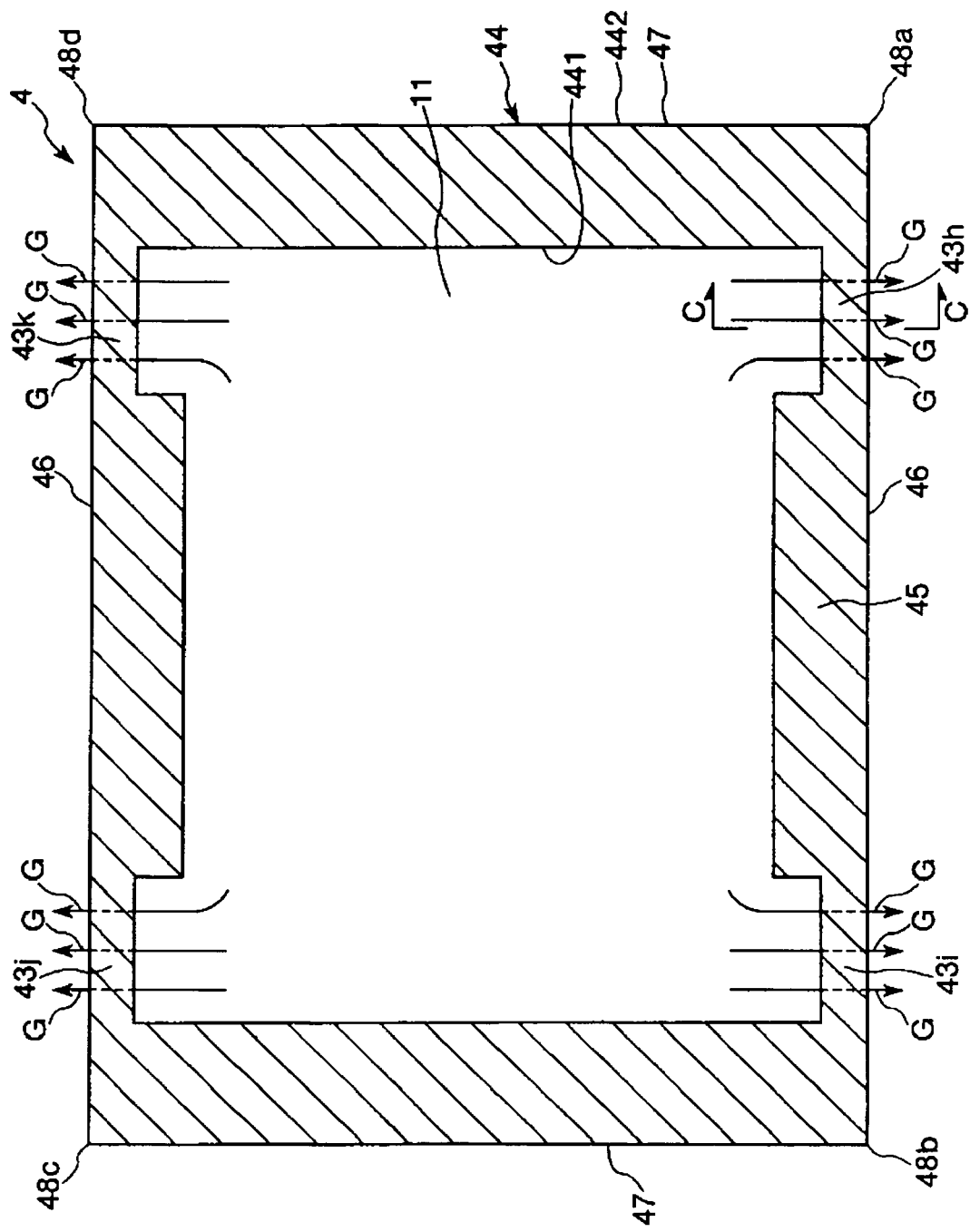
FIG. 6 is a horizontal section view showing a spacer of a semiconductor device in accordance with a fourth embodiment of the present invention.
Figure 7:
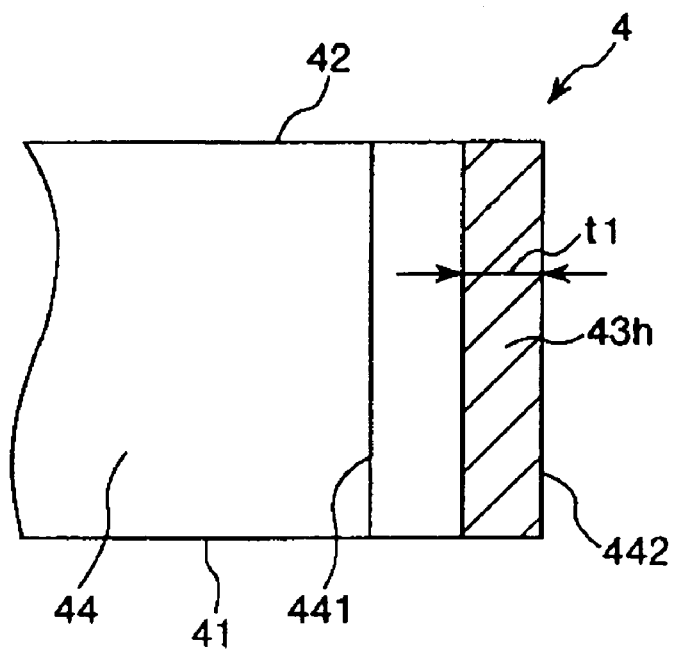
FIG. 7 is a section view (or a vertical section view) taken along a line C-C shown in FIG. 6.

FIG. 6 is a horizontal section view showing a spacer of a semiconductor device in accordance with a fourth embodiment of the present invention. FIG. 7 is a section view (or a vertical section view) taken along a line C-C shown in FIG. 6.

Hereinafter, the semiconductor device in accordance with the fourth embodiment of the present invention will be described with reference to FIGS. 6 and 7. Such description will be made with emphasis placed on the points differing from the preceding embodiments. The same points will be omitted from description.

The present embodiment is the same as the first embodiment, except a difference in positions in which thin wall portions are formed.

In the spacer 4 shown in FIGS. 6 and 7, thin wall portions 43h, 43i, 43j and 43k are formed by partially removing the inner circumferential portion (the inner portion) 441 of the wall 44 of the spacer 4 according to the removal method set forth above. This ensures that the vapor G can pass through, e.g., the thin wall portion 43h easily (or rapidly) and reliably (this holds true for the thin wall portions 43i, 43j and 43k). Therefore, it is possible to reliably prevent occurrence of dew condensation otherwise caused by saturation of the vapor G.

In the present embodiment, no irregularity is formed in the outer circumferential portion 442 of the spacer 4, which means that the outer circumferential portion 442 is formed of surfaces continuously extending in all directions. This helps improve aesthetic appearance of the semiconductor device 1.

While a thickness t1 of each of the thin wall portions 43h to 43k remains constant along the up-and-down direction according to a configuration shown in FIG. 7, the present invention is not limited thereto. Alternatively, the thickness t1 of the thin wall portion 43h may vary in the up-and-down direction.

Fifth Embodiment

Figure 8:
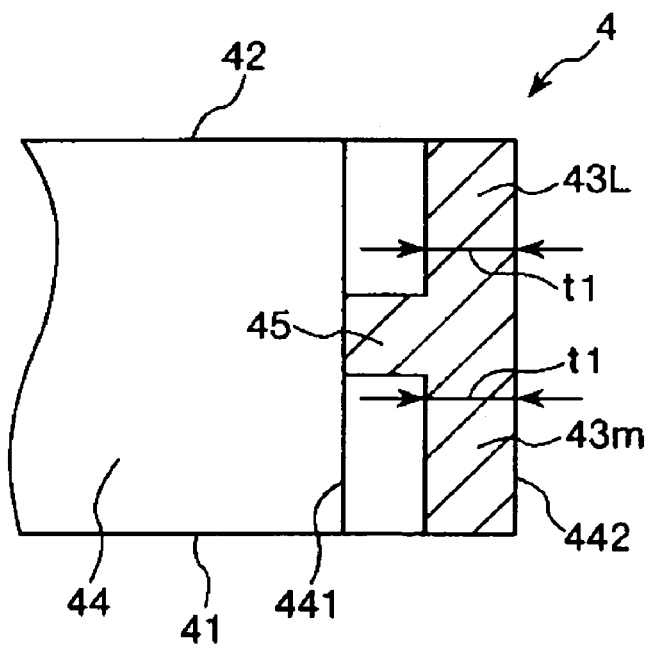
FIG. 8 is a vertical section view showing a spacer of a semiconductor device in accordance with a fifth embodiment of the present invention.

FIG. 8 is a vertical section view showing a spacer of a semiconductor device in accordance with a fifth embodiment of the present invention.

Hereinafter, the semiconductor device in accordance with the fifth embodiment of the present invention will be described with reference to FIG. 8. Such description will be made with emphasis placed on the points differing from the preceding embodiments. The same points will be omitted from description.

The present embodiment is the same as the fourth embodiment, except a difference in a shape (forming mode) of thin wall portions.

In the spacer 4 shown in FIG. 8, the upper and lower regions of the inner circumferential portion 441 of the wall 44 are removed. This produces thin wall portions 43L and 43m positioned one above another and a thick wall portion 45 positioned between the thin wall portions 43L and 43m.

A configuration of the spacer 4 according to the present embodiment is effective in case where an attempt is made to control discharge quantity of the vapor G.

While a thickness t1 of the thin wall portion 43L is the same as a thickness t1 of the thin wall portion 43m according to the configuration shown, the present invention is not limited thereto. Alternatively, the thin wall portions 43L and 43m may differ from each other in the thickness. In case where there is a difference in the thickness t1 of each of the thin wall portions 43L and 43m, the thin wall portion 43L may be thicker than the thin wall portion 43m, and vice versa.

Sixth Embodiment

Figure 9:
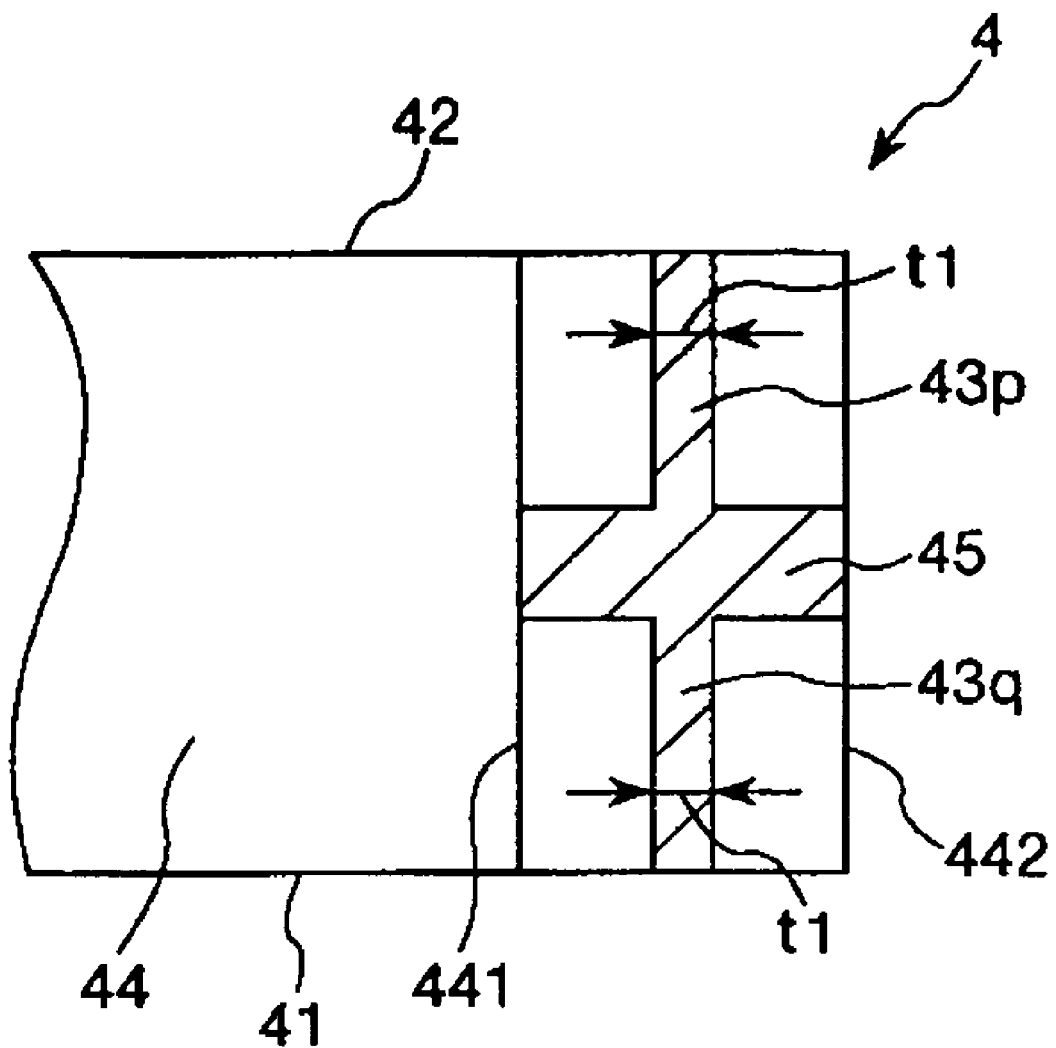
FIG. 9 is a vertical section view showing a spacer of a semiconductor device in accordance with a sixth embodiment of the present invention.

FIG. 9 is a vertical section view showing a spacer of a semiconductor device in accordance with a sixth embodiment of the present invention.

Hereinafter, the semiconductor device in accordance with the sixth embodiment of the present invention will be described with reference to FIG. 9. Such description will be made with emphasis placed on the points differing from the preceding embodiments. The same points will be omitted from description.

The present embodiment is the same as the fifth embodiment, except a difference in a shape (forming mode) of thin wall portions.

In the spacer 4 shown in FIG. 9, the upper and lower regions of the outer circumferential portion 442 of the wall 44 as well as the upper and lower regions of the inner circumferential portion 441 thereof are removed. This produces thin wall portions 43p and 43q positioned one above another and a thick wall portion 45 positioned between the thin wall portions 43p and 43q. The thin wall portions 43p and 43q are positioned substantially in the thickness-wise middle region of the thick wall portion 45.

With the spacer 4 configured as above, a part of the inner circumferential portion 441 and a part of the outer circumferential portion 442 can be removed from the inside and outside of the wall 44 when forming the thin wall portions 43p and 43q. Therefore, it is possible to relatively easily form the thin wall portions 43p and 43q with a thickness t1 thereof kept as small as possible. Moreover, it is possible to reduce a height (in FIG. 9) of the thin wall portions 43p and 43q by leaving (or forming) the thick wall portion 45 between the thin wall portions 43p and 43q. This makes it possible to prevent the thin wall portions 43p and 43q from suffering from excessive reduction in strength (the compression strength in an up-and-down direction in FIG. 9).

Seventh Embodiment

Figure 10:
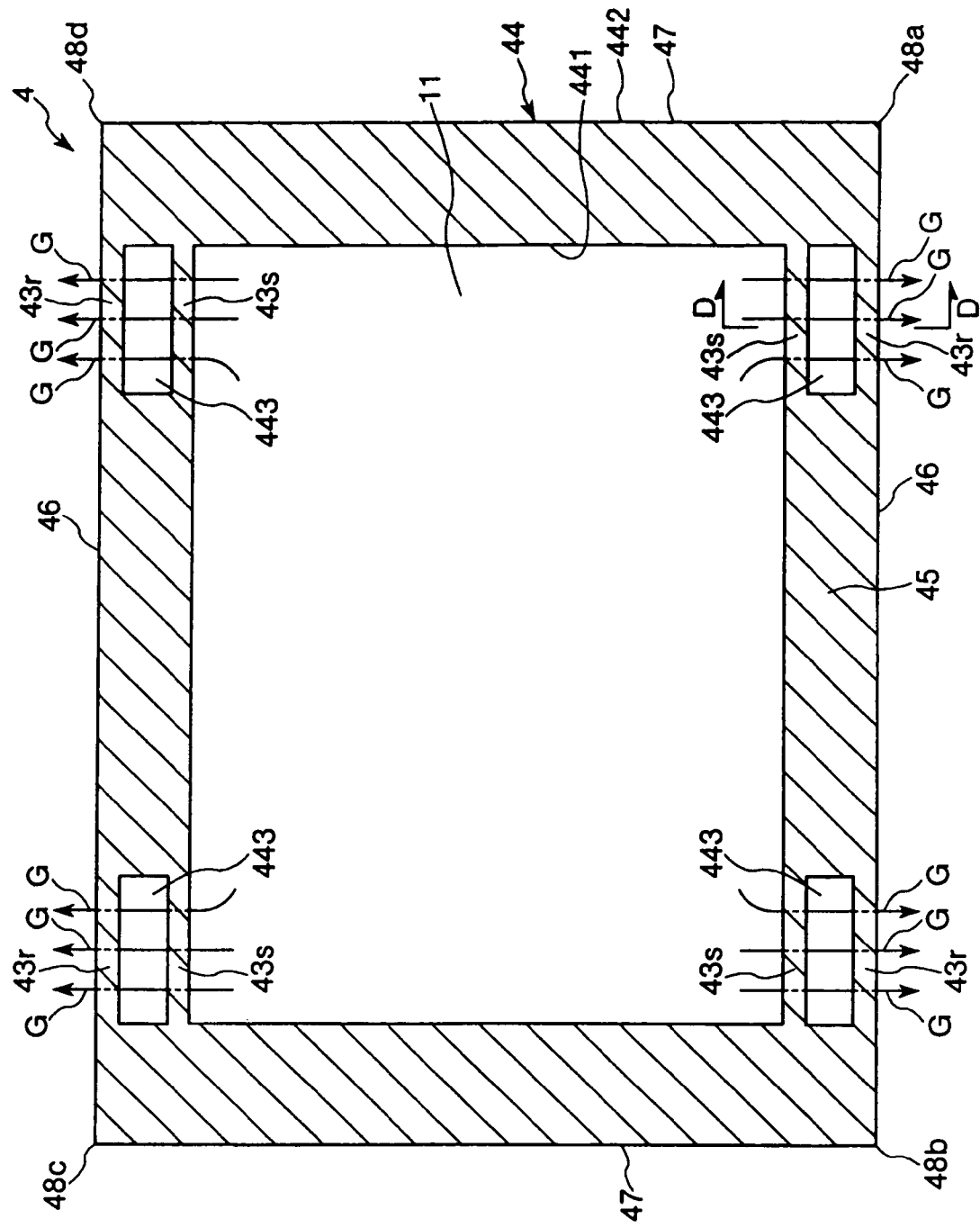
FIG. 10 is a horizontal section view showing a spacer of a semiconductor device in accordance with a seventh embodiment of the present invention.
Figure 11:
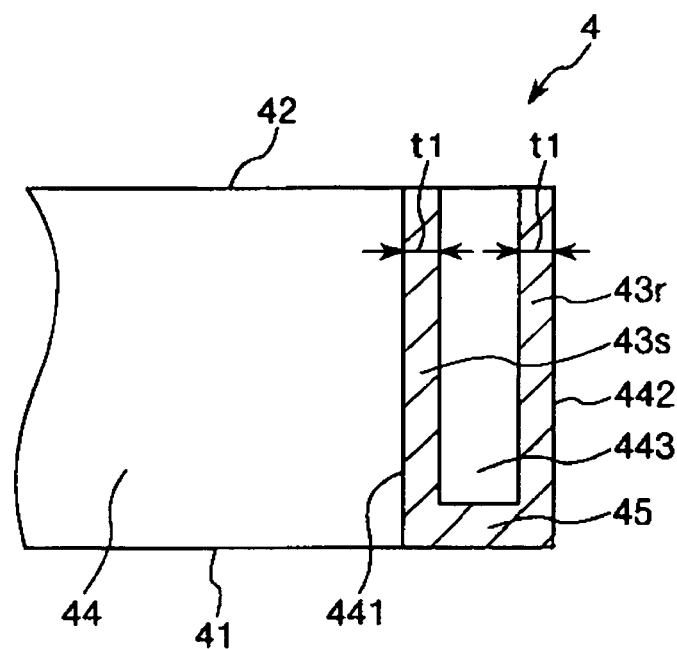
FIG. 11 is a section view (or a vertical section view) taken along a line D-D shown in FIG. 11.

FIG. 10 is a horizontal section view showing a spacer of a semiconductor device in accordance with a seventh embodiment of the present invention. FIG. 11 is a section view (or a vertical section view) taken along a line D-D shown in FIG. 10.

Hereinafter, the semiconductor device in accordance with the seventh embodiment of the present invention will be described with reference to FIGS. 10 and 11. Such description will be made with emphasis placed on the points differing from the preceding embodiments. The same points will be omitted from description.

The present embodiment is the same as the first embodiment, except a difference in positions in which thin wall portions are formed.

In the spacer 4 shown in FIGS. 10 and 11, four hollow portions 443 are formed by partially removing the wall 44 between the upper surface 42 of the wall 44 of the spacer 4 (the surface facing toward the transparent substrate 3) and the portion just above the lower surface 41 thereof according to the removal method mentioned earlier. In this spacer 4, an outer thin wall portion 43r and an inner thin wall portion 43s are formed, with each of the hollow portions 443 lying therebetween. This ensures that the vapor G within the internal space 11 is discharged to the outside through the inner thin wall portion 43s and then through the outer thin wall portion 43r, as can be seen in FIG. 10. Therefore, it is possible to reliably prevent occurrence of dew condensation otherwise caused by saturation of the vapor G.

In the present embodiment, no irregularity is formed in the outer circumferential portion 442 of the spacer 4, which means that the outer circumferential portion 442 is formed of surfaces continuously extending in all directions. This helps improve aesthetic appearance of the semiconductor device 1.

While a thickness t1 of the thin wall portion 43r is the same as a thickness t1 of the thin wall portion 43s according to a configuration shown in FIG. 11, the thin wall portions 43r and 43s may differ from each other in the thickness. In case where there is a difference in the thickness t1 of each of the thin wall portions 43r and 43s, the thickness t1 of the thin wall portion 43r may be greater than the thickness t1 of the thin wall portion 43s, and vice versa.

Eighth Embodiment

Figure 12:
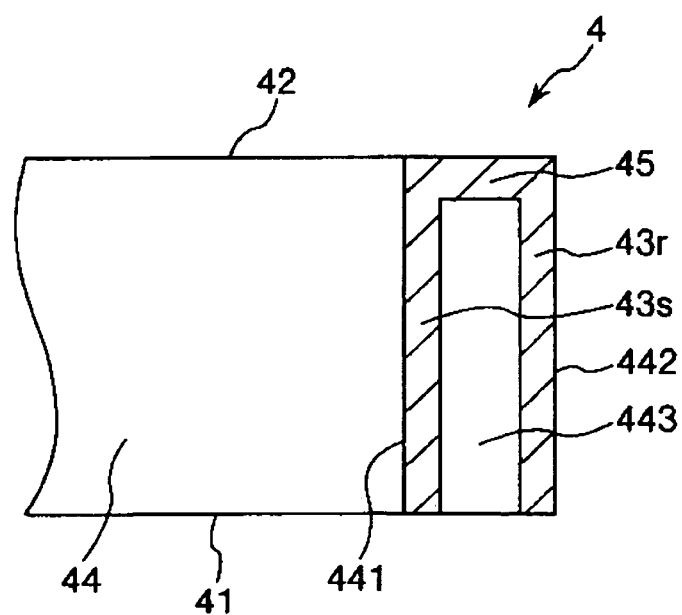
FIG. 12 is a vertical section view showing a spacer of a semiconductor device in accordance with an eighth embodiment of the present invention.

FIG. 12 is a vertical section view showing a spacer of a semiconductor device in accordance with an eighth embodiment of the present invention.

Hereinafter, the semiconductor device in accordance with the eighth embodiment of the present invention will be described with reference to FIG. 12. Such description will be made with emphasis placed on the points differing from the preceding embodiments. The same points will be omitted from description.

The present embodiment is the same as the seventh embodiment, except a difference in a forming mode of hollow portions.

In the spacer 4 shown in FIG. 12, hollow portions 443 are formed by partially removing the wall 44 between the lower surface 41 of the wall 44 of the spacer 4 (the surface facing toward the semiconductor substrate 2) and the portion just below the upper surface 42 thereof according to the removal method mentioned earlier. In this spacer 4, an outer thin wall portion 43r and an inner thin wall portion 43s are formed, with each of the hollow portions 443 lying therebetween. This ensures that the vapor G within the internal space 11 is discharged to the outside through the inner thin wall portion 43s and then through the outer thin wall portion 43r. Therefore, it is possible to reliably prevent occurrence of dew condensation otherwise caused by saturation of the vapor G.

Ninth Embodiment

Figure 13:
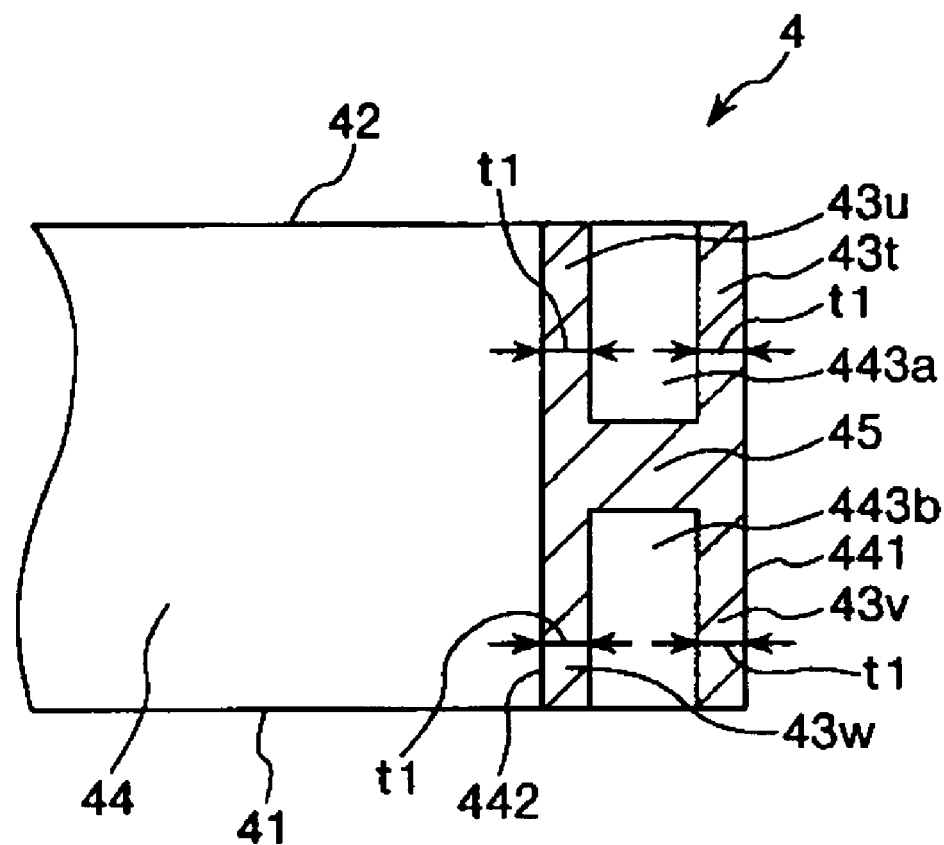
FIG. 13 is a vertical section view showing a spacer of a semiconductor device in accordance with a ninth embodiment of the present invention.

FIG. 13 is a vertical section view showing a spacer of a semiconductor device in accordance with a ninth embodiment of the present invention.

Hereinafter, the semiconductor device in accordance with the ninth embodiment of the present invention will be described with reference to FIG. 13. Such description will be made with emphasis placed on the points differing from the preceding embodiments. The same points will be omitted from description.

The present embodiment is the same as the seventh embodiment, except a difference in a forming mode of hollow portions.

In the spacer 4 shown in FIG. 13, upper hollow portions 443a and lower hollow portions 443b are formed by partially removing the upper and lower portions of the wall 44 of the spacer 4. A thick wall portion 45 lies between each of the upper hollow portions 443a and each of the lower hollow portions 443b. In this spacer 4, an outer thin wall portion 43t and an inner thin wall portion 43u are formed, with each of the upper hollow portions 443a lying therebetween. Likewise, an outer thin wall portion 43v and an inner thin wall portion 43w are formed, with each of the lower hollow portions 443b lying therebetween.

With this configuration, the vapor G within the internal space 11 is discharged to the outside through the inner thin wall portion 43u and then through the outer thin wall portion 43t. Similarly, the vapor G within the internal space 11 is discharged to the outside through the inner thin wall portion 43w and then through the outer thin wall portion 43v. Therefore, it is possible to reliably prevent occurrence of dew condensation otherwise caused by saturation of the vapor G.

In the present embodiment, it is possible to reduce a height (in FIG. 13) of the thin wall portions 43t, 43u, 43v and 43w by forming the thick wall portion 45 between the thin wall portions 43t and 43v and between the thin wall portions 43u and 43w. This makes it possible to prevent the thin wall portions 43t, 43u, 43v and 43w from suffering from excessive reduction in strength (compression strength in an up-and-down direction in FIG. 13), whereby thicknesses t1 of the thin wall portions 43t, 43u, 43v and 43w can be made smaller than the thicknesses t1 of the thin wall portion 43r or 43s of the seventh embodiment.

Tenth Embodiment

Figure 14:
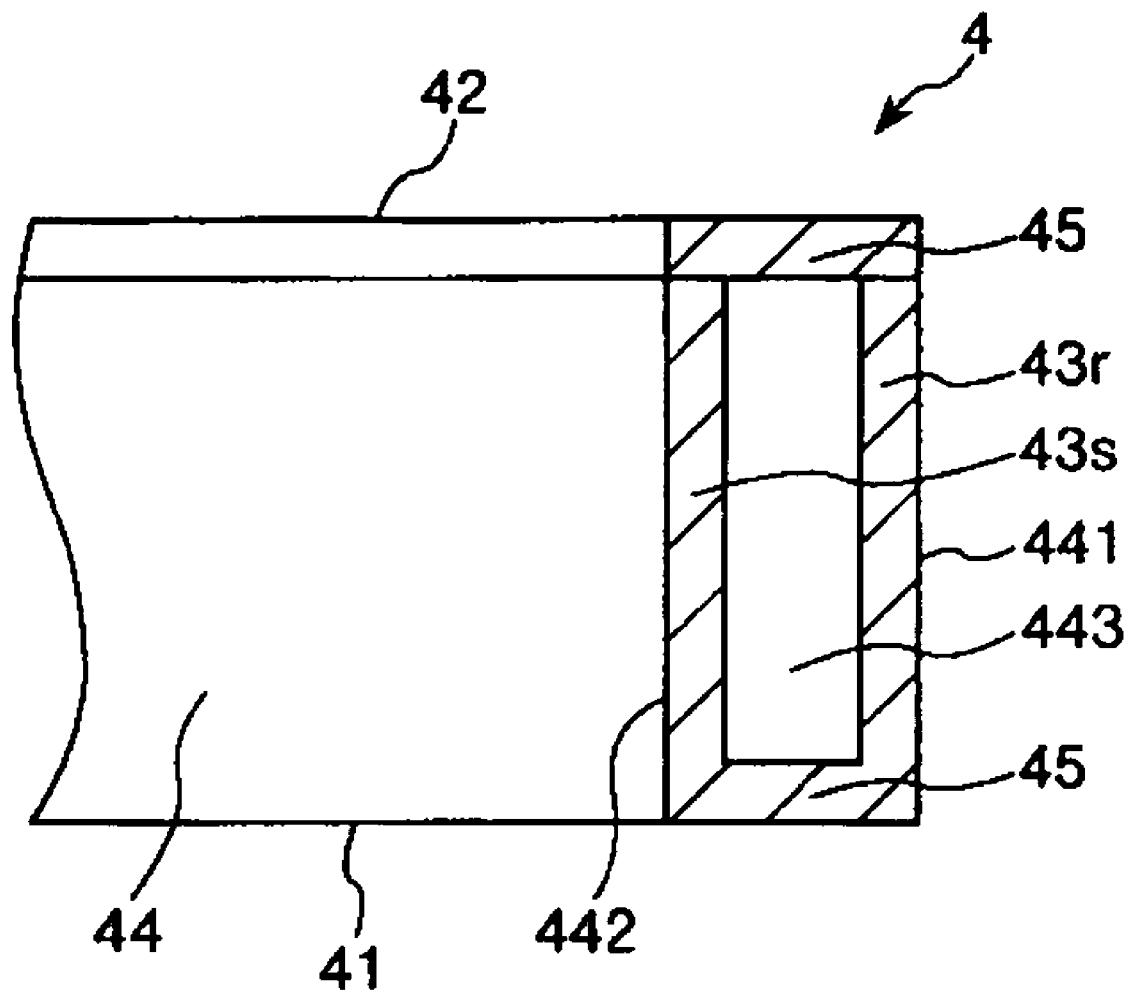
FIG. 14 is a vertical section view showing a spacer of a semiconductor device in accordance with a tenth embodiment of the present invention.

FIG. 14 is a vertical section view showing a spacer of a semiconductor device in accordance with a tenth embodiment of the present invention.

Hereinafter, the semiconductor device in accordance with the tenth embodiment of the present invention will be described with reference to FIG. 14. Such description will be made with emphasis placed on the points differing from the preceding embodiments. The same points will be omitted from description.

The present embodiment is the same as the seventh embodiment, except a difference in a forming mode of hollow portions.

In the spacer 4 shown in FIG. 14, hollow portions 443 are formed inside the wall 44 so that each of the hollow portions 443 can define a closed space. Thin wall portions 43r and 43s are formed, with each of the hollow portions 443 lying therebetween.

In the present embodiment, the semiconductor substrate 2 and the transparent substrate 3 are not directly bonded to the thin wall portions 43r and 43s of the spacer 4 but are bonded to the thick wall portions 45 lying above and below the thin wall portions 43r and 43s. This helps increase bonding strength between the semiconductor substrate 2 and the spacer 4 and bonding strength between the transparent substrate 3 and the spacer 4.

Eleventh Embodiment

Figure 15:
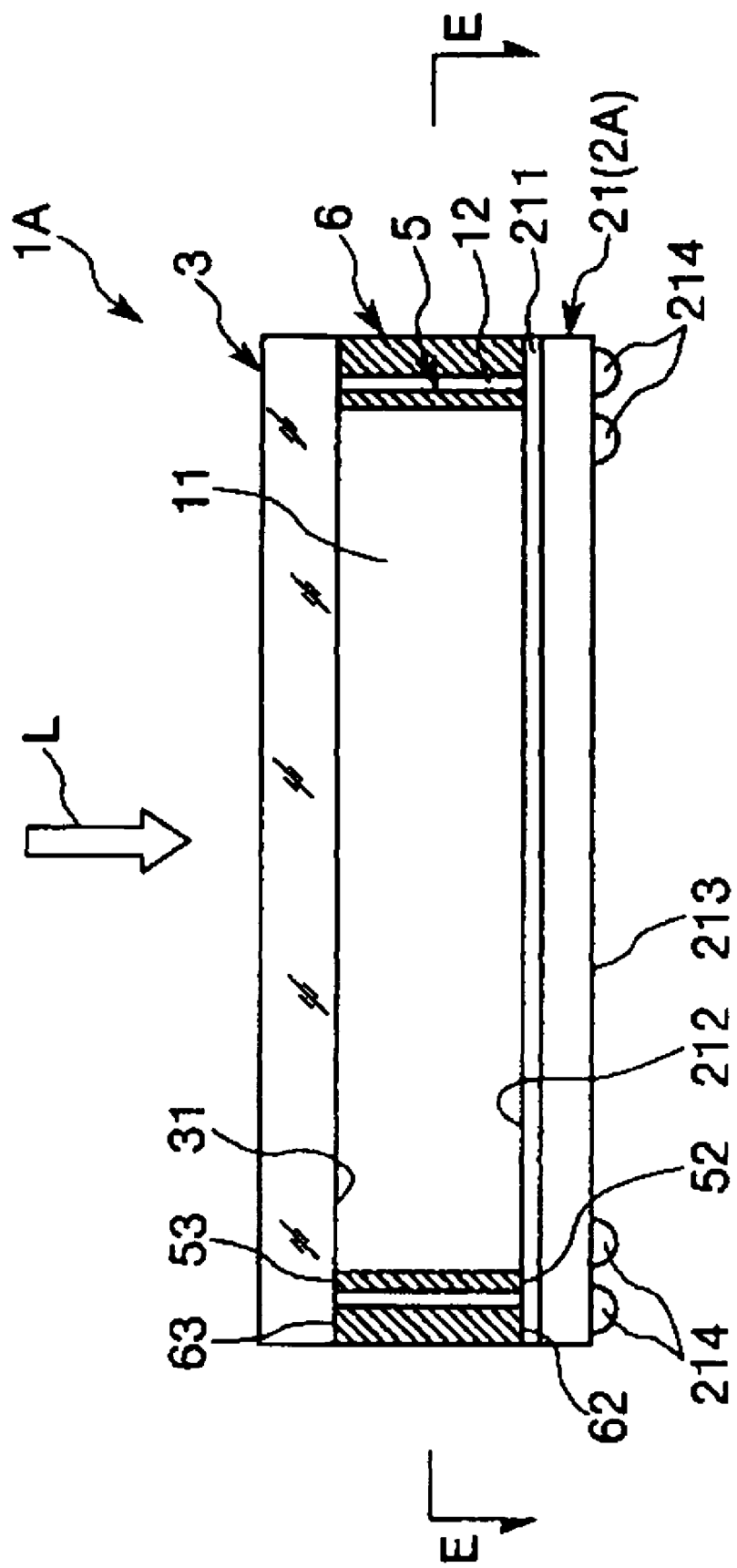
FIG. 15 is a partially sectional view showing a semiconductor device in accordance with an eleventh embodiment of the present invention.
Figure 16:
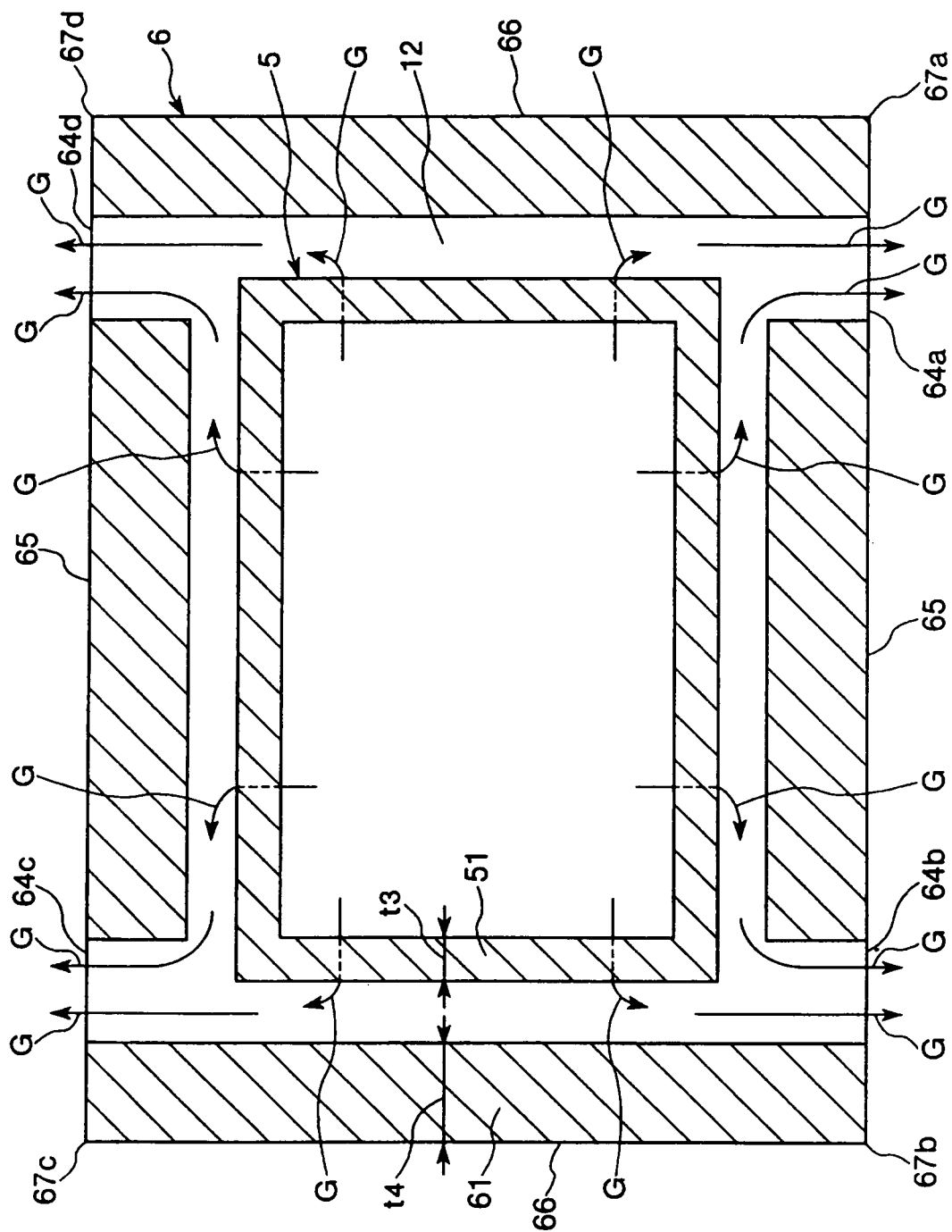
FIG. 16 is a section view (or a horizontal section view) of a spacer of the semiconductor device taken along a line E-E shown in FIG. 15.

FIG. 15 is a partially sectional view showing a semiconductor device in accordance with an eleventh embodiment of the present invention. FIG. 16 is a section view (or a horizontal section view) of a spacer of the semiconductor device taken along a line E-E shown in FIG. 15.

Hereinafter, the semiconductor device in accordance with the eleventh embodiment of the present invention will be described with reference to FIGS. 15 and 16. Such description will be made with emphasis placed on the points differing from the preceding embodiments. The same points will be omitted from description.

The present embodiment is the same as the first embodiment, except a difference in a configuration of a semiconductor substrate and a spacer.

In a semiconductor device 1A shown in FIG. 15, a semiconductor substrate 2A is formed of a semiconductor element 21. An inner spacer 5 and an outer spacer 6, which will be described later, are bonded to an upper surface 212 of a light receiving portion 211 provided on the semiconductor element 21.

A plurality of bumps 214 are arranged in an edge portion of a lower surface 213 of the semiconductor element 21. Each of the bumps 214 has a dome-like shape and protrudes from the lower surface 213 of the semiconductor element 21. Furthermore, each of the bumps 214 is electrically connected to a wiring pattern.

The inner spacer 5 and an outer spacer 6 are arranged between the semiconductor substrate 2A and the transparent substrate 3 to regulate the clearance therebetween. As shown in FIG. 16, each of the inner spacer 5 and an outer spacer 6 has a frame-like shape. The outer spacer 6 is arranged on the outer circumferential side of the inner spacer 5, with a gap 12 left therebetween.

The inner spacer 5 and an outer spacer 6 are vapor-permeable and are formed from a cured product of the resin composition mentioned in connection with the spacer 4 of the first embodiment.

Description will now be made on a configuration of the inner spacer 5 and the outer spacer 6.

Referring to FIG. 16, the inner spacer 5 is of a rectangular shape in a plan view. In an inside of the outer spacer 6, the inner spacer 5 has a lower surface 52 bonded to the entire marginal edge of the upper surface 212 of the light receiving portion 211 provided on the semiconductor element 21 and an upper surface 53 bonded to the entire marginal edge of the lower surface 31 of the transparent substrate 3. Thus, an internal space 11 is kept air-tight, which makes it possible to reliably prevent dust from infiltrating into the internal space 11 (namely, the inside of the semiconductor device 1A). Therefore, it is possible to reliably prevent substantial reduction in light transmittance of the transparent substrate 3, which would otherwise occur when dust adheres to the lower surface 31 of the transparent substrate 3 for instance.

The inner spacer 5 has a wall 51 whose thickness t3 is substantially constant along its circumferential direction. The thickness (average thickness) t3 of the wall 51 of the inner spacer 5 is smaller than a thickness t4 of a wall 61 of the outer spacer 6. In this case, the thickness t3 is preferably in the range of 0.5 to 30% and more preferably in the range of 1 to 15% of the thickness t4. More specifically, if the thickness t4 is equal to about 400 μm, the thickness t3 may be preferably in the range of about 2 to 120 μm and more preferably in the range of 4 to 60 μm.

By adopting such a range of numerical value, it is possible to maintain strength (compression strength and bending strength) of the inner spacer 5. Furthermore, when the vapor G introduced into the internal space 11 is escaped through the wall 51 of the inner spacer 5, it can pass through the wall 51 of the inner spacer 5 easily (or rapidly) and reliably. Therefore, the vapor G is discharged across the nearly entire circumference of the inner spacer 5 (see FIG. 16).

Just like the inner spacer 5, the outer spacer 6 is of a rectangular shape in a plan view. The outer spacer 6 has a size great enough to receive the inner spacer 5 therein (see FIG. 16). As shown in FIG. 15, the outer spacer 6 has a lower surface 62 bonded to the entire marginal edge of the upper surface 212 of the light receiving portion 211 of the semiconductor element 21 and an upper surface 63 bonded to the entire marginal edge of the lower surface 31 of the transparent substrate 3.

In the outer spacer 6, there is formed a plurality of through-holes 64a, 64b, 64c and 64d extending through the wall 61 thereof. Each of the through-holes 64a, 64b, 64c and 64d serves as a vent hole through which the vapor G flows. Each of the through-holes 64a, 64b, 64c and 64d has a left-and-right width in FIG. 16, which is set greater than a gap distance (gap length) of the gap 12.

The respective through-holes 64a, 64b, 64c and 64d are arranged in the long sides 65 of the outer spacer 6 rather than the short sides 66. More specifically, the through-holes 64a and 64b are positioned in the lower long side 65 in FIG. 16, and the through-holes 64c and 64d are positioned in the upper long side 65 in FIG. 16.

The through-holes 64a and 64c are positioned near respective corner portions 67a and 67c lying on one diagonal line of the outer spacer 6. The through-holes 64b and 64d are positioned near respective corner portions 67b and 67d lying on the other diagonal line of the outer spacer 6.

The vapor G escaped through the inner spacer 5 flows along the gap 12 and is discharged through the through-holes 64a, 64b, 64c and 64d (see FIG. 16). Thus, the vapor G can be sufficiently discharged from the internal space 11 before the vapor G is saturated within the internal space 11. This makes it possible to reliably prevent occurrence of dew condensation in the inner wall of the semiconductor device 1A (in the inner circumferential portion or inner circumferential surface of the wall 51 or in the lower surface 31 of the transparent substrate 3), particularly in the lower surface 31 of the transparent substrate 3. The vapor G flowing along the gap 12 may sometimes be discharged through the wall 61 of the outer spacer 6.

In the semiconductor device 1A, the vapor G flows between the space 11 and the outside through the through-holes 64a, 64b, 64c and 64d. This means that the vapor discharge points are specified in the semiconductor device 1A.

As mentioned above, the through-holes 64a and 64c are positioned near the corner portions 67a and 67c of the outer spacer 6, and the through-holes 64b and 64d are positioned near the corner portions 67b and 67d of the outer spacer 6. In other words, the through-holes 64a and 64c lie opposite to each other across the space 11 and, similarly, the through-holes 64b and 64d lie opposite to each other across the space 11. Such an arrangement assures enhanced escape of the vapor G, as compared to a case where the through-holes 64a, 64b, 64c and 64d are concentratedly arranged along one long side 65.

While the gap 12 is formed between the wall 51 of the inner spacer 5 and the wall 61 of the outer spacer 6, the present invention is not limited thereto. Alternatively, the wall 51 of the inner spacer 5 and the wall 61 of the outer spacer 6 may be brought into contact with each other.

Twelfth Embodiment

Figure 17:
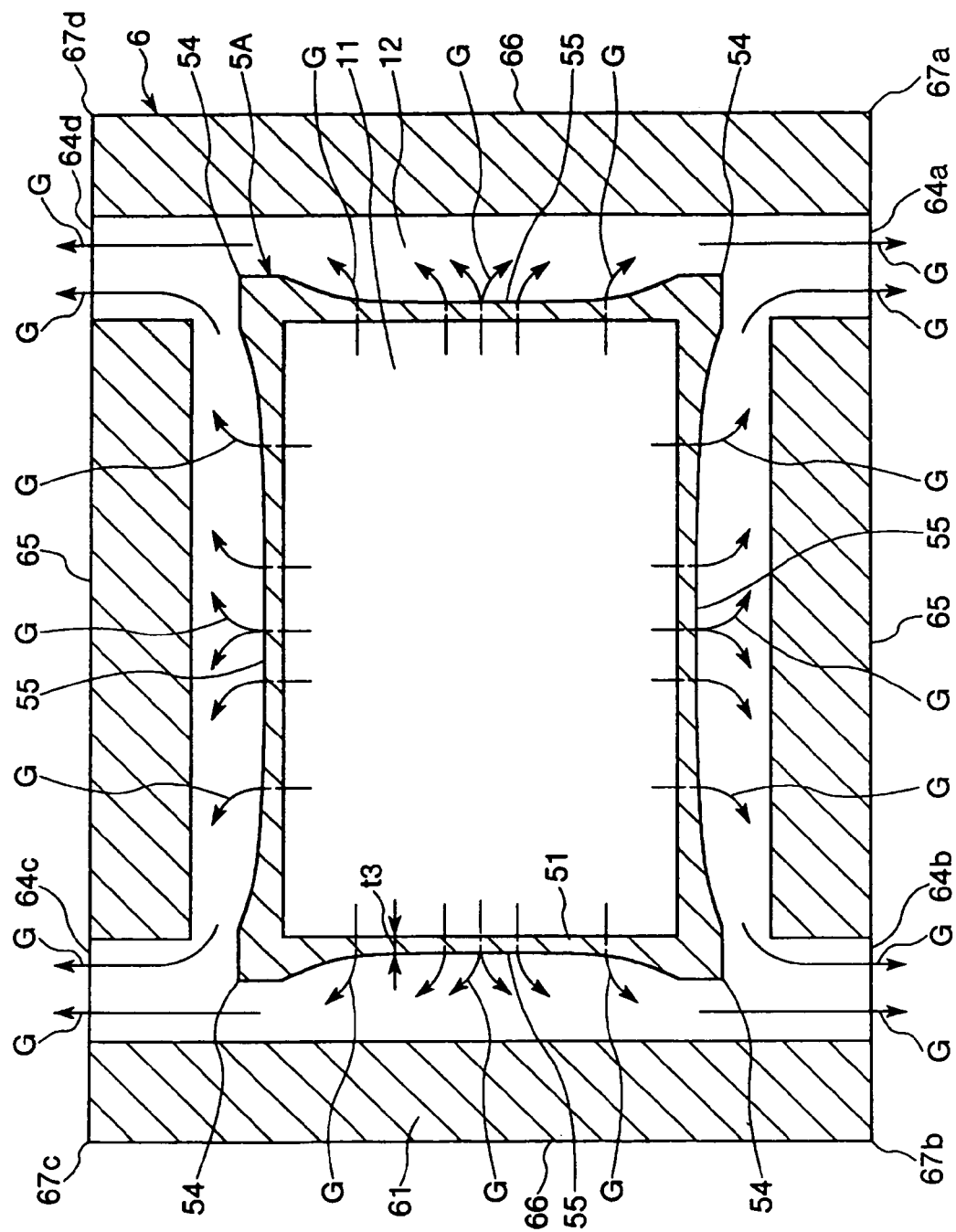
FIG. 17 is a horizontal section view showing a spacer of a semiconductor device in accordance with a twelfth embodiment of the present invention.

FIG. 17 is a horizontal section view showing a spacer of a semiconductor device in accordance with a twelfth embodiment of the present invention.

Hereinafter, the semiconductor device in accordance with the twelfth embodiment of the present invention will be described with reference to FIG. 17. Such description will be made with emphasis placed on the points differing from the preceding embodiments. The same points will be omitted from description.

The present embodiment is the same as the eleventh embodiment, except a difference in a shape of a wall of an inner spacer.

In an inner spacer 5A shown in FIG. 17, a thickness t3 of a wall 51 varies along a circumferential direction. In other words, the thickness t3 of the wall 51 in each side of the inner spacer 5A is gradually decreased from the vicinities of the opposite corner portions 54 toward a middle portion 55. Thus, the vapor G within the internal space 11 can be rapidly escaped through the middle portion 55 and its vicinities. As a result, the vapor G is sufficiently discharged from the internal space 11, which makes it possible to reliably prevent occurrence of dew condensation in a inner wall of a semiconductor device 1A.

Thirteenth Embodiment

Figure 18:
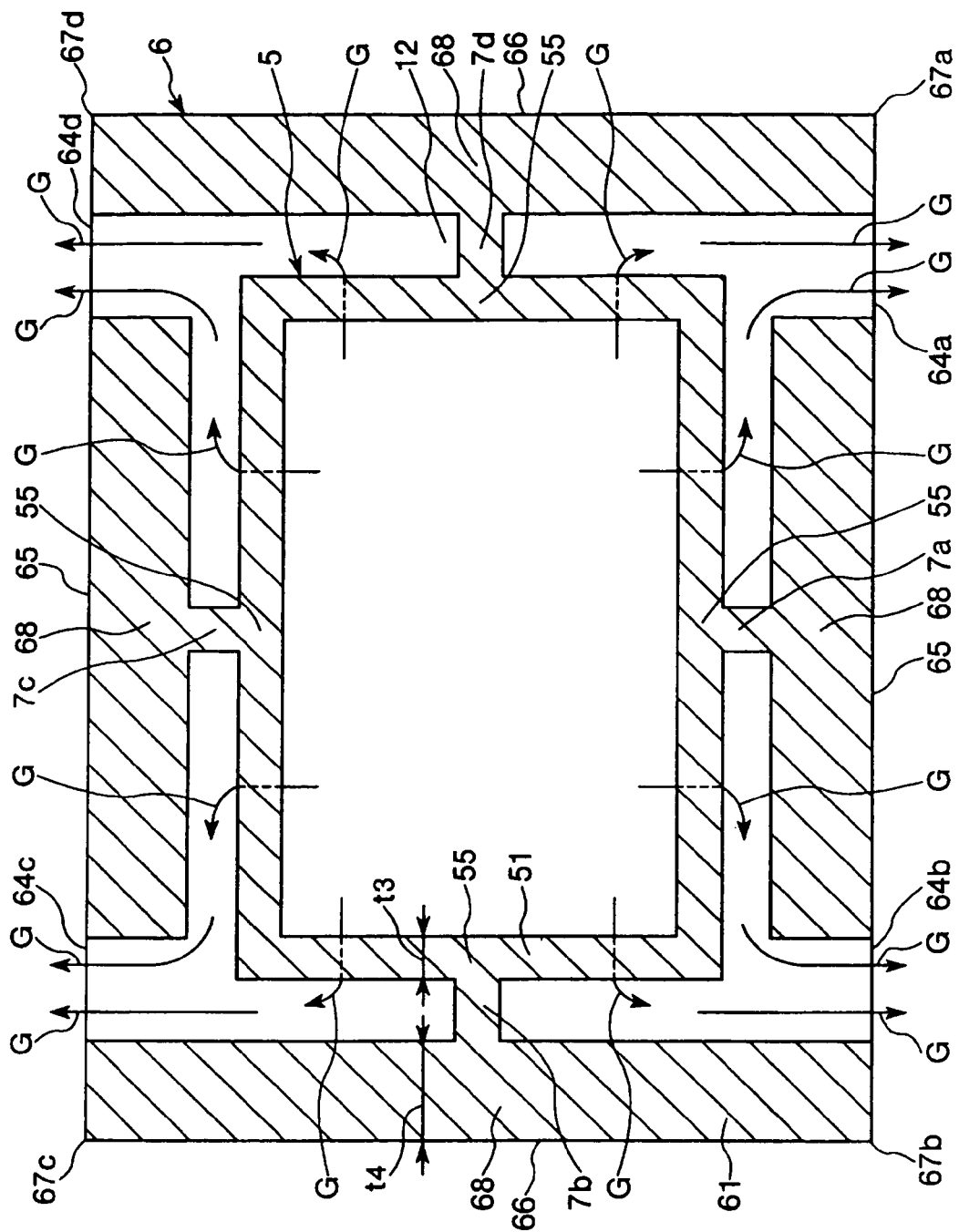
FIG. 18 is a horizontal section view showing a spacer of a semiconductor device in accordance with a thirteenth embodiment of the present invention.

FIG. 18 is a horizontal section view showing a spacer of a semiconductor device in accordance with a thirteenth embodiment of the present invention.

Hereinafter, the semiconductor device in accordance with the thirteenth embodiment of the present invention will be described with reference to FIG. 18. Such description will be made with emphasis placed on the points differing from the preceding embodiments. The same points will be omitted from description.

The present embodiment is the same as the eleventh embodiment, except that a semiconductor device includes connecting portions for interconnecting an inner spacer and an outer spacer.

Referring to FIG. 18, four connecting portions 7a, 7b, 7c and 7d for interconnecting the inner spacer 5 and the outer spacer 6 are provided between the inner spacer 5 and the outer spacer 6. Each of the connecting portions 7a, 7b, 7c and 7d interconnects a middle portion 55 of each side of the inner spacer 5 and a middle portion 68 of each side of the outer spacer 6. The inner spacer 5 is reinforced by the connecting portions 7a, 7b, 7c and 7d thus arranged, which makes it possible to further reduce a thickness t3 of the inner spacer 5.

A through-hole 64b is positioned between the neighboring connecting portions 7a and 7b, the through-hole 64c between the neighboring connecting portions 7b and 7c, the through-hole 64d between the neighboring connecting portions 7c and 7d, and a through-hole 64a between the neighboring connecting portions 7a and 7d. This eliminates the possibility that the vapor G flowing toward, e.g., the through-hole 64a, is blocked by the connecting portions 7a and 7d, thus allowing the vapor G to be reliably discharged through the through-hole 64a. As stated above, the connecting portions 7a, 7b, 7c and 7d are of a structure (arrangement) that does not affect draining property (escaping property) of the vapor G.

The connecting portions 7a, 7b, 7c and 7d may be either integrally formed with the inner spacer 5 and the outer spacer 6 or provided independently of the inner spacer 5 and the outer spacer 6.

While a number of the connecting portions is four in a configuration illustrated, the present invention is not limited thereto. Alternatively, the number of the connecting portions may be one, two, three or five or more.

While the semiconductor device of the present invention has been described hereinabove with reference to the illustrated embodiments, the present invention is not limited thereto. The respective parts of the semiconductor device may be replaced by other arbitrary parts that can perform the same functions. In addition, arbitrary constituent parts may be added to the semiconductor device.

The semiconductor device of the present invention may be the combination of two or more of the embodiments described above.

While a number of the thin wall portions is four in the first to tenth embodiments, the present invention is not limited thereto. Alternatively, the number of the thin wall portions may be one, two, three or five or more.

While a number of the through-holes is four in the eleventh and twelfth embodiments, the present invention is not limited thereto. Alternatively, the number of the thin wall portions may be one, two, three or five or more.

What is claimed is:

1. A semiconductor device comprising:
a semiconductor substrate comprised of an interposer having one surface and a semiconductor element provided on the one surface of the interposer, the semiconductor element including a light receiving portion for receiving light thereon;
a transparent substrate having light-transmitting property and one surface facing the light receiving portion, the transparent substrate arranged in a spaced-apart relationship with the one surface of the interposer through a gap formed between the one surface of the interposer and the one surface of the transparent substrate; and
a spacer formed in a shape of a frame, the spacer positioned between the one surface of the interposer and the one surface of the transparent substrate for regulating the gap, and the spacer having an inner surface and an outer surface,
wherein the one surface of the interposer, the one surface of the transparent substrate and the inner surface of the spacer form a space which is hermetically sealed, and
wherein the spacer has a wall including at least one thin wall portion and a thick wall portion other than the at least one thin wall portion, and a vapor permeability of the at least one thin wall portion is greater than a vapor permeability of the thick wall portion, wherein a vapor allowed to flow into the space through the wall of the spacer from an outside preferentially permeates from the space to the outside through the thin wall portion.

2. The semiconductor device as claimed in claim 1, wherein the spacer has two thin wall portions lying opposite to each other across the space.

3. The semiconductor device as claimed in claim 2, wherein that the spacer has a diagonal line and a first corner portion and a second corner portion lying on the diagonal line in a plan view, the two thin wall portions are formed near the first corner portion and the second corner portion of the spacer, respectively.

4. The semiconductor device as claimed in claim 1, wherein the thin wall portion is formed by partially removing the wall of the spacer.

5. The semiconductor device as claimed in claim 1, wherein the thin wall portion is formed by partially removing at least one of the inner surface of the spacer and the outer surface of the spacer.

6. The semiconductor device as claimed in claim 1, wherein the spacer has an upper surface being in contact with the one surface of the transparent substrate and an lower surface being in contact with the one surface of the interposer, and the thin wall portion is formed by partially removing at least one of the upper surface and the lower surface of the spacer.

7. The semiconductor device as claimed in claim 1, wherein the thin wall portion has a portion of a varying thickness.

8. The semiconductor device as claimed in claim 1, wherein an average thickness of the thin wall portion is in the range of 2 to 15% to an average thickness of the thick wall portion.

9. The semiconductor device as claimed in claim 1, wherein an average thickness of the thin wall portion is in the range of 10 to 50 μm.

10. The semiconductor device as claimed in claim 1, wherein the spacer is constituted of a cured product of a resin composition containing a photocurable resin.

11. The semiconductor device as claimed in claim 10, wherein the photocurable resin contains at least one of an acryl-based resin and a cyclic olefin-based resin.

12. A semiconductor device comprising:
a semiconductor substrate including a light receiving portion for receiving light thereon, the light receiving portion having one surface;
a transparent substrate having light-transmitting property and one surface facing the light receiving portion, the transparent substrate arranged in a spaced-apart relationship with the one surface of the light receiving portion through a gap formed between the one surface of the light receiving portion and the one surface of the transparent substrate;
a first spacer formed in a shape of a frame, the first spacer positioned between the one surface of the light receiving portion and the one surface of the transparent substrate for regulating the gap, and the first spacer having an inner surface and an outer surface; and
a second spacer formed in a shape of a frame, the second spacer positioned inside the first spacer for regulating the gap, the second spacer having an inner surface and an outer surface,
wherein the one surface of the light receiving portion, the one surface of the transparent substrate and the inner surface of the second spacer form a space which is hermetically sealed,
wherein the first spacer has a wall and at least one through-hole formed in the wall, and the second spacer has a wall that can be permeated by a vapor allowed to flow into the space through the wall of the second spacer and the at least one through-hole of the first spacer from an outside, and
wherein the vapor flows from the space to the outside through the through-hole of the first spacer and the wall of the second spacer.

13. The semiconductor device as claimed in claim 12, wherein a thickness of the wall of the second spacer is smaller than a thickness of the wall of the first spacer.

14. The semiconductor device as claimed in claim 12, wherein the first spacer and the second spacer are spaced apart from each other.

15. The semiconductor device as claimed in claim 12, wherein an average thickness of the wall of the second spacer is in the range of 2 to 15% to an average thickness of the wall of the first spacer.

16. The semiconductor device as claimed in claim 12, wherein an average thickness of the wall of the second spacer is in the range of 10 to 50 μm.

17. The semiconductor device as claimed in claim 12, wherein the wall of the second spacer has a portion of circumferentially varying thickness.

18. The semiconductor device as claimed in claim 12, wherein the first spacer has two through-holes lying opposite to each other across the space and the second spacer.

19. The semiconductor device as claimed in claim 18, wherein that the first spacer has a diagonal line and a first corner portion and a second corner portion lying on the diagonal line in a plan view, and the two through-holes are formed near the first corner portion and the second corner portion of the first spacer, respectively.

20. The semiconductor device as claimed in claim 12, wherein the first spacer is permeated by the vapor.

21. The semiconductor device as claimed in claim 12, wherein the second pacer is constituted of a cured product of a resin composition containing a photocurable resin.

22. The semiconductor device as claimed in claim 21, wherein the photocurable resin contains at least one of an acryl-based resin and a cyclic olefin-based resin.

23. The semiconductor device as claimed in claim 12 further comprises a connecting portion for interconnecting the inner surface of the first spacer and the outer surface of the second spacer.

* * * * *